United States Patent
Chang et al.

(10) Patent No.: US 11,363,175 B2
(45) Date of Patent: *Jun. 14, 2022

(54) CAMERA MODULE AND ELECTRONIC DEVICE

(71) Applicant: LARGAN DIGITAL CO.,LTD., Taichung (TW)

(72) Inventors: Lin An Chang, Taichung (TW); Ming-Ta Chou, Taichung (TW)

(73) Assignee: LARGAN DIGITAL CO., LTD., Taichung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/037,341

(22) Filed: Sep. 29, 2020

(65) Prior Publication Data

US 2021/0067668 A1 Mar. 4, 2021

Related U.S. Application Data

(63) Continuation of application No. 16/455,349, filed on Jun. 27, 2019, now Pat. No. 10,841,471.

(30) Foreign Application Priority Data

May 15, 2019 (TW) .................. 108116710

(51) Int. Cl.
*H04N 5/225* (2006.01)
*G02B 13/00* (2006.01)
*H01L 27/146* (2006.01)

(52) U.S. Cl.
CPC ....... *H04N 5/2254* (2013.01); *G02B 13/0015* (2013.01); *H01L 27/14618* (2013.01)

(58) Field of Classification Search
CPC .. H04N 5/2254; G02B 13/0015; G02B 7/021; G02B 13/0045; G02B 13/0065;
(Continued)

(56) References Cited

U.S. PATENT DOCUMENTS

2007/0127139 A1* 6/2007 Funahashi ............ G02B 15/145
359/696
2009/0231537 A1* 9/2009 Yamamiya ............ G03B 17/00
349/200
(Continued)

FOREIGN PATENT DOCUMENTS

WO 2019/047838 A1 3/2019

OTHER PUBLICATIONS

Indian Office Action issued in corresponding application No. 201934033868, dated Feb. 23, 2021.

*Primary Examiner* — Shahbaz Nazrul
(74) *Attorney, Agent, or Firm* — Maschoff Brennan

(57) ABSTRACT

A camera module includes a housing, a unitary element, an optical lens assembly, an image-side light blocking assembly and a driving device. The unitary element is one-piece formed from a lens carrier and a lens barrel and movably disposed in the housing. The optical lens assembly is disposed in the unitary element. The image-side light blocking assembly includes at least one light blocking sheet, and the image-side light blocking assembly does not contact the optical lens assembly. The driving device is disposed between the housing and the unitary element. The driving device drives the unitary element, the optical lens assembly and the image-side light blocking assembly to move in an optical axis direction parallel to an optical axis of the optical lens assembly by electromagnetic force. A minimal inner opening of the unitary element is located between the optical lens assembly and the image-side light blocking assembly.

21 Claims, 21 Drawing Sheets

(58) Field of Classification Search
CPC ... H01L 27/14618; G03B 17/12; G03B 11/04; G03B 13/36
See application file for complete search history.

(56) References Cited

U.S. PATENT DOCUMENTS

| | | | |
|---|---|---|---|
| 2015/0042870 A1* | 2/2015 | Chan | G02B 7/102 348/357 |
| 2015/0124162 A1* | 5/2015 | Park | H04N 5/2257 348/374 |
| 2016/0377881 A1 | 12/2016 | Jung et al. | |
| 2018/0224665 A1* | 8/2018 | Im | G02B 7/021 |
| 2019/0004328 A1* | 1/2019 | Lee | H04N 5/2257 |
| 2020/0137274 A1* | 4/2020 | Lee | G02B 13/0065 |

* cited by examiner

CAMERA MODULE AND ELECTRONIC DEVICE

RELATED APPLICATIONS

This application is a continuation patent application of U.S. patent application Ser. No. 16/455,349, filed on Jun. 27, 2019, which claims priority to Taiwan Application 108116710, filed on May 15, 2019, which is incorporated by reference herein in its entirety.

BACKGROUND

Technical Field

The present disclosure relates to a camera module and an electronic device, more particularly to a camera module applicable to an electronic device.

Description of Related Art

With the development of semiconductor manufacturing technology, the performance of image sensors has been improved, and the pixel size thereof has been scaled down. Therefore, featuring high image quality becomes one of the indispensable features of an optical system nowadays.

The stray light generated inside the optical system has a significant impact on the imaging quality. Specifically, when there is strong light near the place where an imaged object is located, some unnecessary light generated by the strong light enters into the optical system and is received by an image sensor, thereby resulting in halo around the imaged object. One way to reduce stray light is to mount additional optical components with specific shape in a lens assembly to block stray light. However, the additional optical components may increase the overall size of the optical system such that it is unfavorable for compactness.

Accordingly, how to improve the optical system for achieving a compact size and blocking stray light so as to meet the requirement of high-end-specification electronic devices is an important topic in this field nowadays.

SUMMARY

According to one aspect of the present disclosure, a camera module includes a housing, a unitary element, an optical lens assembly, an image-side light blocking assembly and a driving device. The housing is configured to form a housing space. The unitary element is one-piece formed from a lens carrier and a lens barrel, and the unitary element is movably disposed in the housing space. The optical lens assembly is disposed in the unitary element. The image-side light blocking assembly is located on an image side of the optical lens assembly. The image-side light blocking assembly includes at least one light blocking sheet, and the image-side light blocking assembly does not contact the optical lens assembly. The driving device is disposed between the housing and the unitary element. The driving device includes a first driving member and a second driving member corresponding to each other. The first driving member is disposed on an element outer surface of the unitary element, and the second driving member is disposed in the housing space. There is no relative movement among the unitary element, the optical lens assembly and the image-side light blocking assembly. The driving device drives the unitary element, the optical lens assembly and the image-side light blocking assembly to move in an optical axis direction parallel to an optical axis of the optical lens assembly by electromagnetic force. A minimal inner opening of the unitary element is located between the optical lens assembly and the image-side light blocking assembly. A diameter of the minimal inner opening is smaller than an outer diameter of every lens element of the optical lens assembly, and the diameter of the minimal inner opening is also smaller than an outer diameter of every element of the image-side light blocking assembly.

According to another aspect of the present disclosure, an electronic device includes the aforementioned camera module and an image sensor.

BRIEF DESCRIPTION OF THE DRAWINGS

The disclosure can be better understood by reading the following detailed description of the embodiments, with reference made to the accompanying drawings as follows.

DETAILED DESCRIPTION

Figure 1:
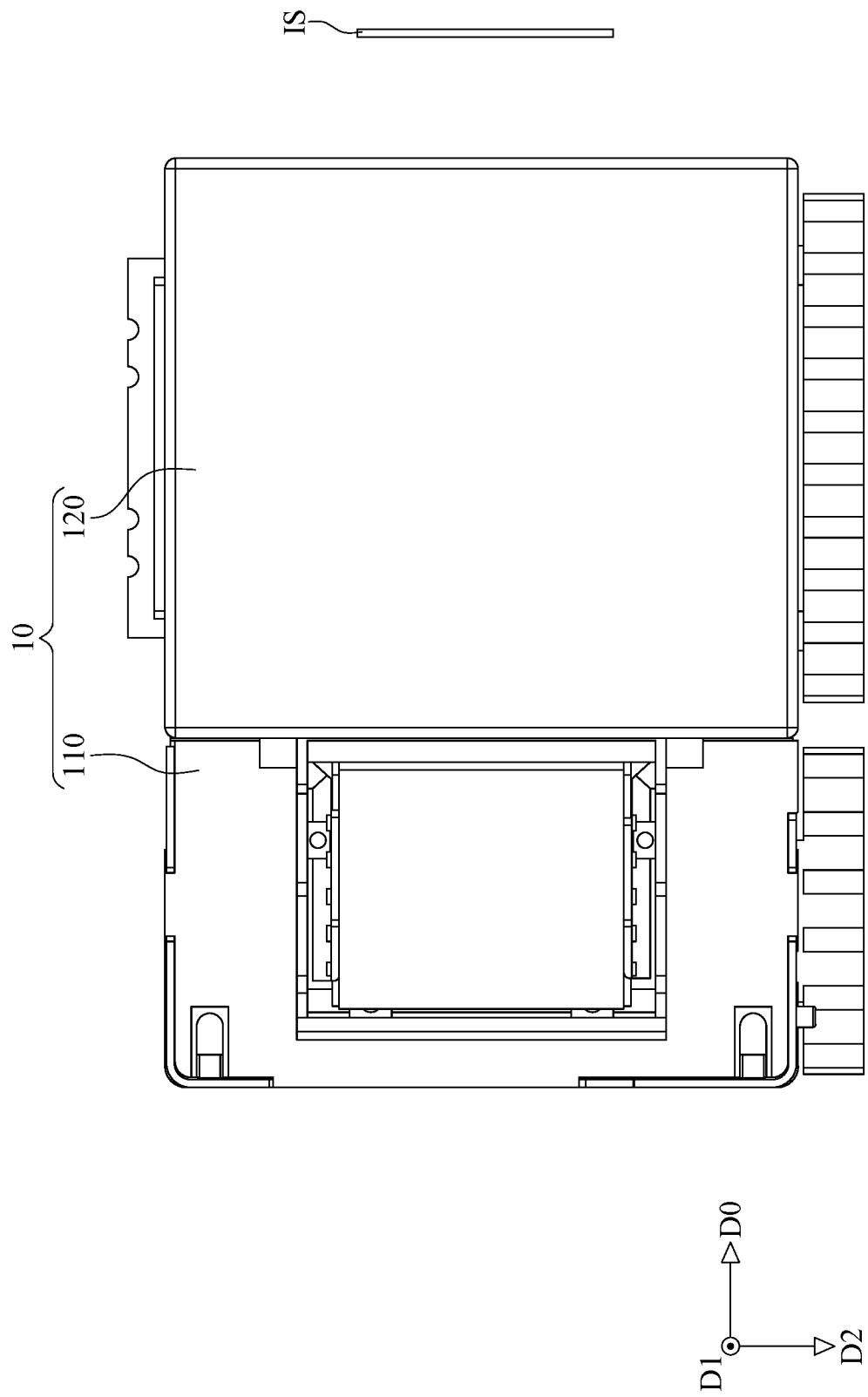
FIG. 1 is a side view of an electronic device according to the 1st embodiment of the present disclosure.

A camera module includes a housing, a unitary element, an optical lens assembly, an image-side light blocking assembly and a driving device. There is no relative movement among the unitary element, the optical lens assembly and the image-side light blocking assembly.

The housing is configured to form a housing space. The unitary element is one-piece formed from a lens carrier and a lens barrel, and the unitary element is movably disposed in the housing space. The optical lens assembly is disposed in the unitary element. Therefore, the unitary element is favorable for reducing the size of the camera module.

The image-side light blocking assembly is located on an image side of the optical lens assembly, and the image-side light blocking assembly does not contact the optical lens assembly. The image-side light blocking assembly includes at least one light blocking sheet. Therefore, the image-side light blocking assembly is favorable for improving the efficiency of blocking stray light; also, the image-side light blocking assembly is at a position with less influence on the arrangement of lens elements, such that it is favorable for reducing assembling deviation.

An automatic focusing function of the camera module is performed by the driving device. The driving device is disposed between the housing and the unitary element, and the driving device includes a first driving member and a second driving member. The first driving member is disposed on an element outer surface of the unitary element. The second driving member is disposed in the housing space and corresponds to the first driving member. The driving device drives the unitary element, the optical lens assembly and the image-side light blocking assembly to move in an optical axis direction parallel to an optical axis of the optical lens assembly by electromagnetic force.

The unitary element includes a minimal inner opening located between the optical lens assembly and the image-side light blocking assembly. The diameter of the minimal inner opening is smaller than the outer diameter of every lens element of the optical lens assembly, and the diameter of the minimal inner opening is also smaller than the outer diameter of every element of the image-side light blocking assembly. Therefore, the minimal inner opening working with the image-side light blocking assembly is favorable for preventing an image sensor from receiving stray light.

According to the present disclosure, the camera module can further include an image-side assembling member. The image-side assembling member is disposed on one side of the unitary element closer to the image side. The image-side assembling member includes a member inner surface and a member outer surface opposite to each other, the member inner surface surrounds the optical axis, and the member outer surface is farther away from the optical axis than the member inner surface. The unitary element can include a first contact surface. Either the member inner surface or the member outer surface of the image-side assembling member includes a second contact surface corresponding to the first contact surface, and the first contact surface contacts the second contact surface. Therefore, it is favorable for selecting a proper assembling method for mounting the image-side assembling member according to different specifications of the camera module, thereby improving assembling efficiency.

A plurality of stripe-shaped structures can be disposed on either the first contact surface of the unitary element or the second contact surface of the image-side assembling member. Each of the stripe-shaped structures is in a shape of strip and extends along the optical axis direction. Therefore, it is favorable for providing sufficient strength in order to stably assemble the unitary element with the image-side assembling member.

The image-side light blocking assembly can be accommodated in the image-side assembling member, and the image-side light blocking assembly contacts the image-side assembling member. Therefore, it is favorable for more freedom to adjust the configuration of image-side light blocking assembly according to different light shading requirements.

The image-side assembling member can non-overlap the first driving member in a direction orthogonal to the optical axis. Therefore, it is favorable for increasing manufacturing yield rate.

According to the present disclosure, the camera module can further include a light blocking unit disposed between the minimal inner opening of the unitary element and the image-side assembling member. An object-side surface of the light blocking unit is abutted with the unitary element, and an image-side surface of the light blocking unit is abutted with the image-side assembling member. Therefore, it is favorable for further improving the efficiency of blocking stray light. Moreover, since the light blocking unit is sandwiched between the unitary element and the image-side assembling member, the light blocking unit is prevented from warping.

The image-side light blocking assembly can be accommodated in the unitary element, and the image-side light blocking assembly contacts the unitary element. Therefore, it is favorable for efficient assembly.

The image-side light blocking assembly can include a retaining element, and the image-side light blocking assembly is positioned in the unitary element by the retaining element. Therefore, it is favorable for enhancing the structural stability.

The unitary element can include a third contact surface, and the retaining element can include a fourth contact surface corresponding to the third contact surface. The third contact surface contacts the fourth contact surface. A plurality of stripe-shaped structures can be disposed on either the third contact surface or the fourth contact surface. Each of the stripe-shaped structures is in a shape of strip and extends along the optical axis direction. Therefore, it is favorable for providing sufficient strength in order to stably assemble the unitary element with the image-side light blocking assembly.

According to the present disclosure, the first driving member and the second driving member of the driving device can be a combination of at least one coil and at least one magnet. Specifically, the first driving member includes a coil and the second driving member includes a magnet, or alternatively, the first driving member includes a magnet and the second driving member includes a coil. Therefore, the coil and the magnet jointly generate electromagnetic force (Lorentz force) so as to achieve automatic focusing.

The number of the magnet and the number of the coil are both two. The two magnets are disposed on opposite sides of the optical axis, and the two coils are also disposed on opposite sides of the optical axis. The unitary element, the two magnets and the two coils can be in a linear arrangement along a direction orthogonal to the optical axis. Therefore, it is favorable for reducing the height of the camera module so as to achieve compactness.

Herein, a first direction and a second direction are defined as two directions orthogonal to the optical axis direction, and the first direction is orthogonal to the second direction. When a length of the unitary element in the optical axis direction is A, a height of the unitary element in the first direction is B, and a width of the unitary element in the second direction is C, the following condition can be satisfied: 0.03<(C−B)/A<0.3. Therefore, with the requirement of reducing overall height of the camera module, it is a proper range of sizes for molding the unitary element.

At least a part of the optical lens assembly can non-overlap the unitary element in the first direction. Therefore, it is favorable for keeping the camera module compact.

Each light blocking sheet of the image-side light blocking assembly can include a non-circular opening. The non-circular opening includes a plurality of line section parts arranged along a circumferential direction of the optical axis, and the number of the line section parts is four or more. Therefore, it is favorable for reducing the probability of generating additional reflected light rays from a cross-section of the light blocking sheet.

According to the present disclosure, the image-side light blocking assembly includes at least three light blocking sheets. Therefore, it is favorable for improving the efficiency of blocking stray light.

According to the present disclosure, the camera module can further include a first optical path folding element. Herein, a first folding angle is defined as an angle formed between a first optical path and a second optical path, and the second optical path is parallel to the optical axis of the optical lens assembly. The first optical path folding element is disposed between the first optical path and the second optical path. Therefore, it is favorable for the camera module applicable to thin electronic devices.

According to the present disclosure, the camera module can further include a second optical path folding element. Herein, a second folding angle is defined as an angle formed between the second optical path and a third optical path. The second optical path folding element is disposed between the second optical path and the third optical path. Therefore, it is favorable for the camera module applicable to thin electronic devices.

The image-side light blocking assembly can include an image-side light blocking sheet closest to the image side. When an axial distance between the image-side light blocking sheet and the minimal inner opening of the unitary element is H1, and the diameter of the minimal inner opening is H2, the following condition can be satisfied: 0.05<H1/H2<0.90. Therefore, it is favorable for the image-side light blocking assembly having a wide light shading range for achieving high light shading efficiency.

When the number of lens elements of the optical lens assembly is N, the following condition can be satisfied: 4≤N≤10. Therefore, it is favorable for providing the camera module with high image resolution.

When a maximum field of view of the camera module is FOV, the following condition can be satisfied: 10 [deg.] <FOV<40 [deg.]. Therefore, it is favorable for providing the camera module with high magnification.

The optical lens assembly includes a plurality of lens elements. With respect to two of the lens elements that are adjacent to each other, one lens element is closer to an object side of the optical lens assembly, and the other lens element is closer to the image side of the optical lens assembly. A maximum outer diameter of the lens element, which is closer to the object side, can be larger than a maximum outer diameter of the lens element, which is closer to the image side. Therefore, it is favorable for a stable assembly of the lens elements so as to improve production efficiency and imaging quality.

According to the present disclosure, the housing of the camera module can include a first housing element, a second housing element and a third housing element. The first housing element is configured to accommodate the optical path folding element closer to the object side. The second housing element is configured to accommodate the unitary element. The third housing element is configured to accommodate the optical path folding element closer to the image side. The optical path folding element is, for example but not limited to, a prism, a reflective mirror or a beam splitter for reflection of light.

According to the present disclosure, the housing can further include a base configured to contact an image sensor, and the base can be assembled with the image sensor. The base is an optional element of the housing, and the present disclosure is not limited thereto.

According to the present disclosure, the image-side light blocking assembly can include a light blocking sheet, a spacing element and a retaining element, and the present disclosure is not limited thereto.

According to the present disclosure, the image-side assembling member can be made of black plastic material, and the image-side assembling member can be manufactured by injection molding.

According to the present disclosure, the aforementioned features and conditions can be utilized in numerous combinations so as to achieve corresponding effects.

According to the above description of the present disclosure, the following specific embodiments are provided for further explanation.

1st Embodiment

Figure 2:
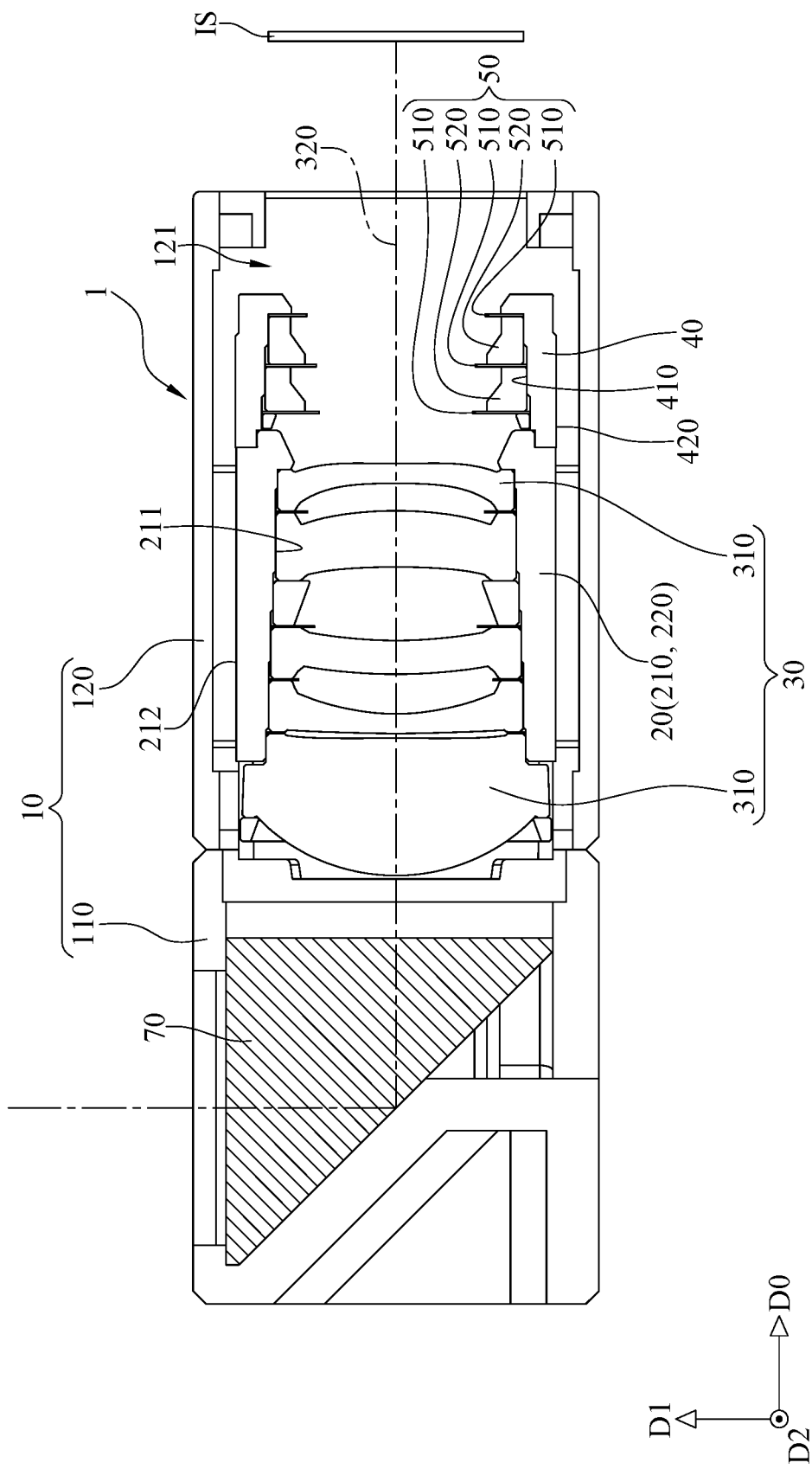
FIG. 2 is a cross-sectional view of the electronic device in FIG. 1.
Figure 3:
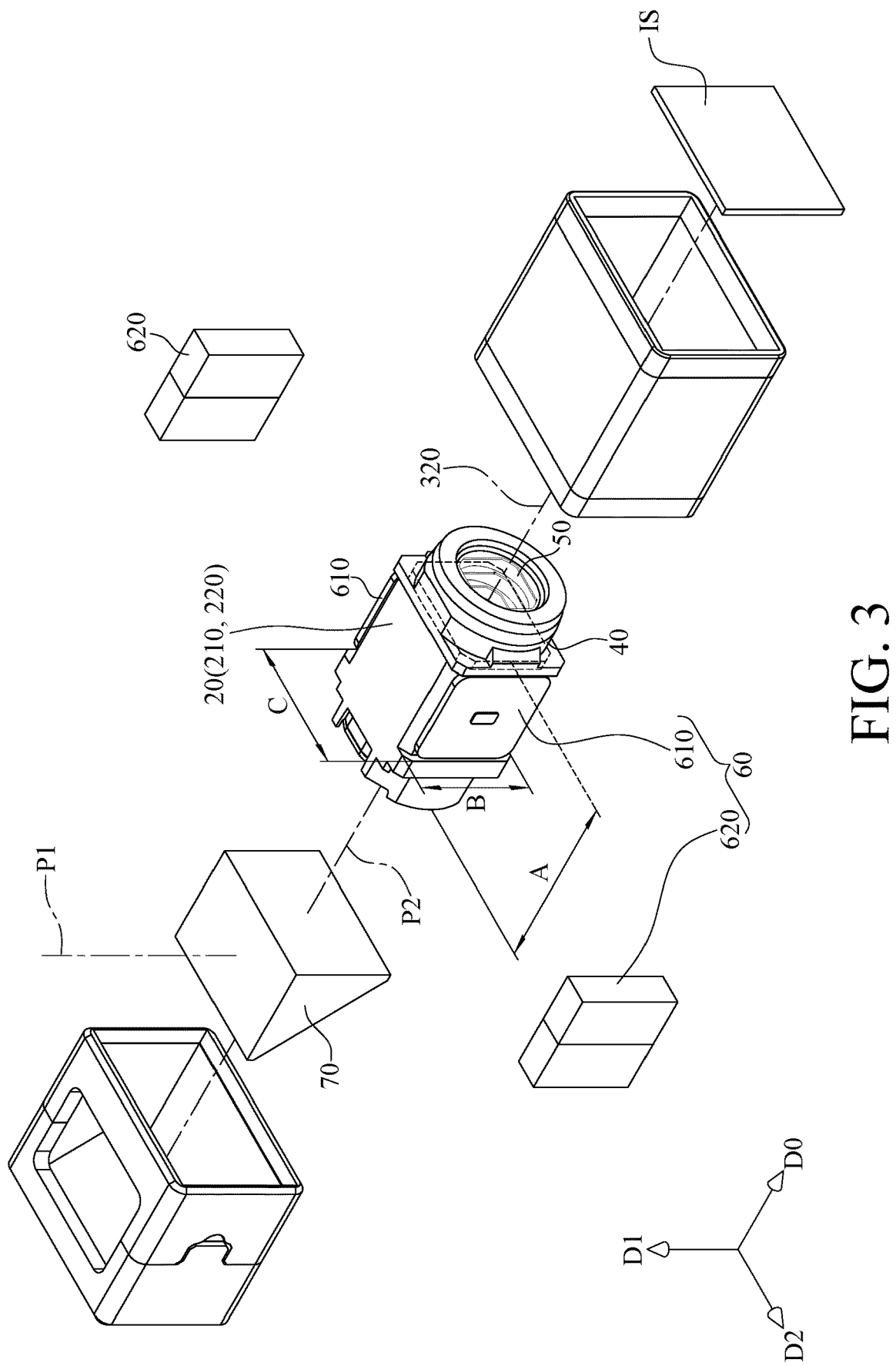
FIG. 3 is an exploded view of the electronic device in FIG. 1.
Figure 4:
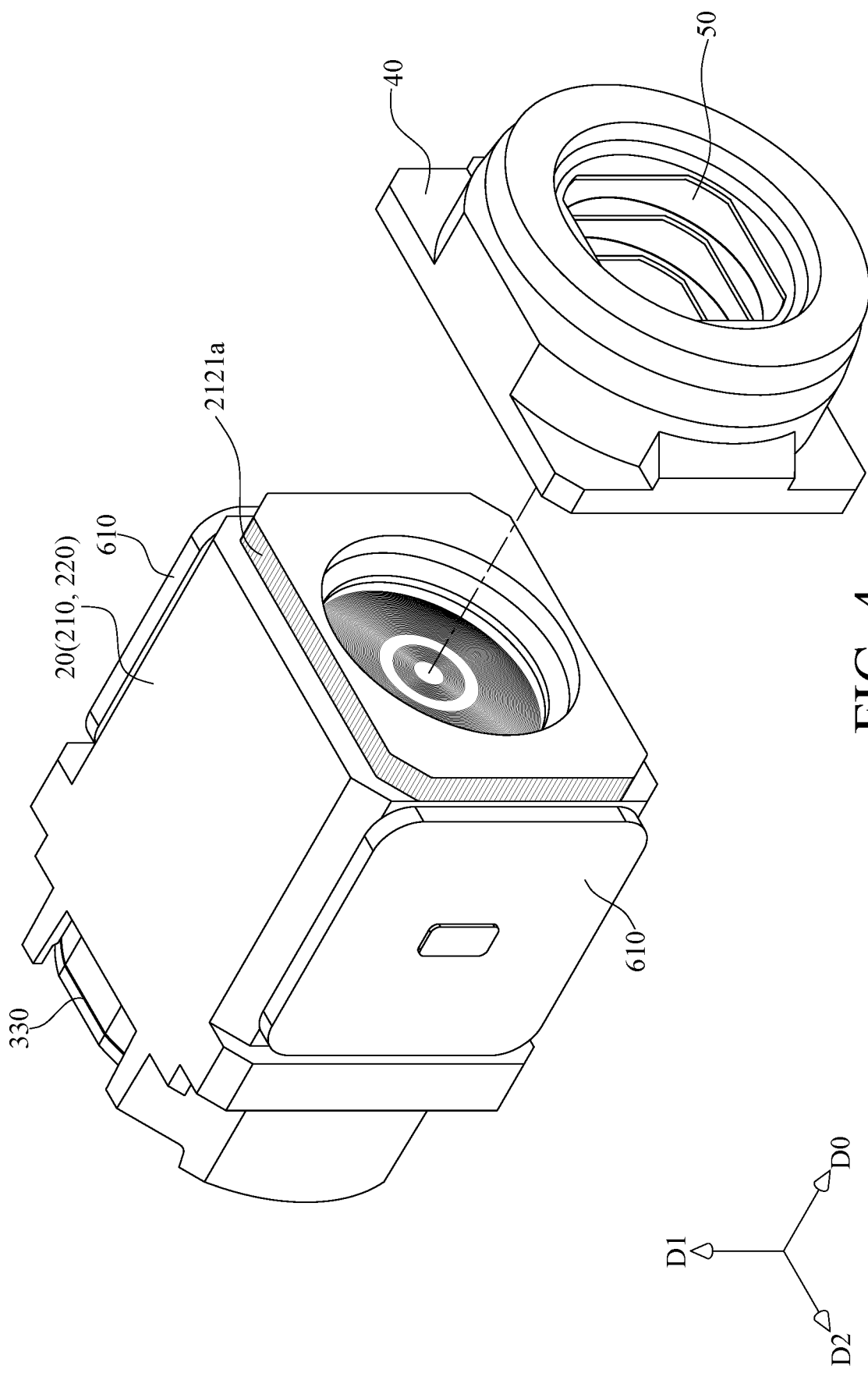
FIG. 4 is an exploded view of a camera module in FIG. 3.

Please refer FIG. 1 through FIG. 4. FIG. 1 is a side view of an electronic device according to the 1st embodiment of the present disclosure. FIG. 2 is a cross-sectional view of the electronic device in FIG. 1. FIG. 3 is an exploded view of the electronic device in FIG. 1. FIG. 4 is an exploded view of a camera module in FIG. 3. In this embodiment, an electronic device includes a camera module 1 and an image sensor IS. The camera module 1 includes a housing 10, a unitary element 20, an optical lens assembly 30, an image-side assembling member 40, an image-side light blocking assembly 50, a driving device 60 and an optical path folding element 70.

The housing 10 includes a first housing element 110 and a second housing element 120. The second housing element 120 is configured to form a housing space 121.

The unitary element 20 is one-piece formed from a lens carrier 210 and a lens barrel 220. The unitary element 20 is movably disposed in the housing space 121 of the second housing element 120. The unitary element 20 includes an element inner surface 211 and an element outer surface 212 opposite to each other.

The optical lens assembly 30 is disposed in the unitary element 20, and the optical lens assembly 30 includes a plurality of lens elements 310. The element inner surface 211 of the unitary element 20 surrounds the optical axis 320 of the optical lens assembly 30, and the element outer surface 212 is farther away from the optical axis 320 than the element inner surface 211.

The image-side assembling member 40 is disposed on the unitary element 20 and close to the image side. More specifically, the image-side assembling member 40 is disposed between the optical lens assembly 30 and the image sensor IS. The image-side assembling member 40 includes a member inner surface 410 and a member outer surface 420 opposite to each other. The member inner surface 410 surrounds the optical axis 320 of the optical lens assembly 30, and the member outer surface 420 is farther away from the optical axis 320 than the member inner surface 410.

The image-side light blocking assembly 50 is accommodated in the image-side assembling member 40, and the image-side light blocking assembly 50 contacts the image-side assembling member 40. The image-side light blocking assembly 50 includes at least one light blocking sheet 510 and at least one spacing element 520. The light blocking sheet 510 is located on the image side of the optical lens assembly 30, and the light blocking sheet 510 does not contact the optical lens assembly 30. In this embodiment, the image-side light blocking assembly 50 includes a total of three light blocking sheets 510 and two spacing elements 520. The light blocking sheets 510 and the spacing elements 520 are arranged in a staggered manner.

The driving device 60 is disposed between the housing 10 and the unitary element 20. The driving device 60 includes a first driving member 610 and a second driving member 620. The first driving member 610 is disposed on the element outer surface 212 of the unitary element 20, the second driving member 620 is disposed on the second housing element 120 and corresponds to the first driving member 610. In this embodiment, the first driving member 610 includes two coils respectively disposed on opposite sides of the optical axis 320, and the second driving member 620 includes two magnets respectively disposed on opposite sides of the optical axis 320. There is no relative movement among the unitary element 20, the optical lens assembly 30 and the image-side light blocking assembly 50. The electromagnetic force generated by the driving device 60 drives the unitary element 20, the optical lens assembly 30 and the image-side light blocking assembly 50 to move in an optical axis direction D0 parallel to the optical axis 320 of the optical lens assembly 30.

The optical path folding element 70 is disposed in the first housing element 110 of the housing 10. In detail, the optical path folding element 70 is disposed between a first optical path P1 and a second optical path P2. The second optical path P2 is parallel to the optical axis 320 of the optical lens assembly 30, and the unitary element 20 is located on the second optical path P2. A first folding angle is formed between the first optical path P1 and the second optical path P2. In this embodiment, the first optical path P1 is perpendicular to the second optical path P2; that is, the first folding angle is a right angle.

As shown in FIG. 3, a first direction D1 and a second direction D2 are defined as two directions orthogonal to the optical axis direction D0, wherein the first direction D1 is orthogonal to the second direction D2. The image-side assembling member 40 non-overlaps the first driving member 610 of the driving device 60 in the second direction D2. The unitary element 20, the first driving member 610 (coils) and the second driving member 620 (magnets) are in a linear arrangement along the second direction D2.

At least a part of the optical lens assembly 30 non-overlaps the unitary element 20 in the first direction D1. As shown in FIG. 4, an object-side portion 330 of the optical lens assembly 30 non-overlaps the unitary element 20 in the first direction D1.

Figure 5:
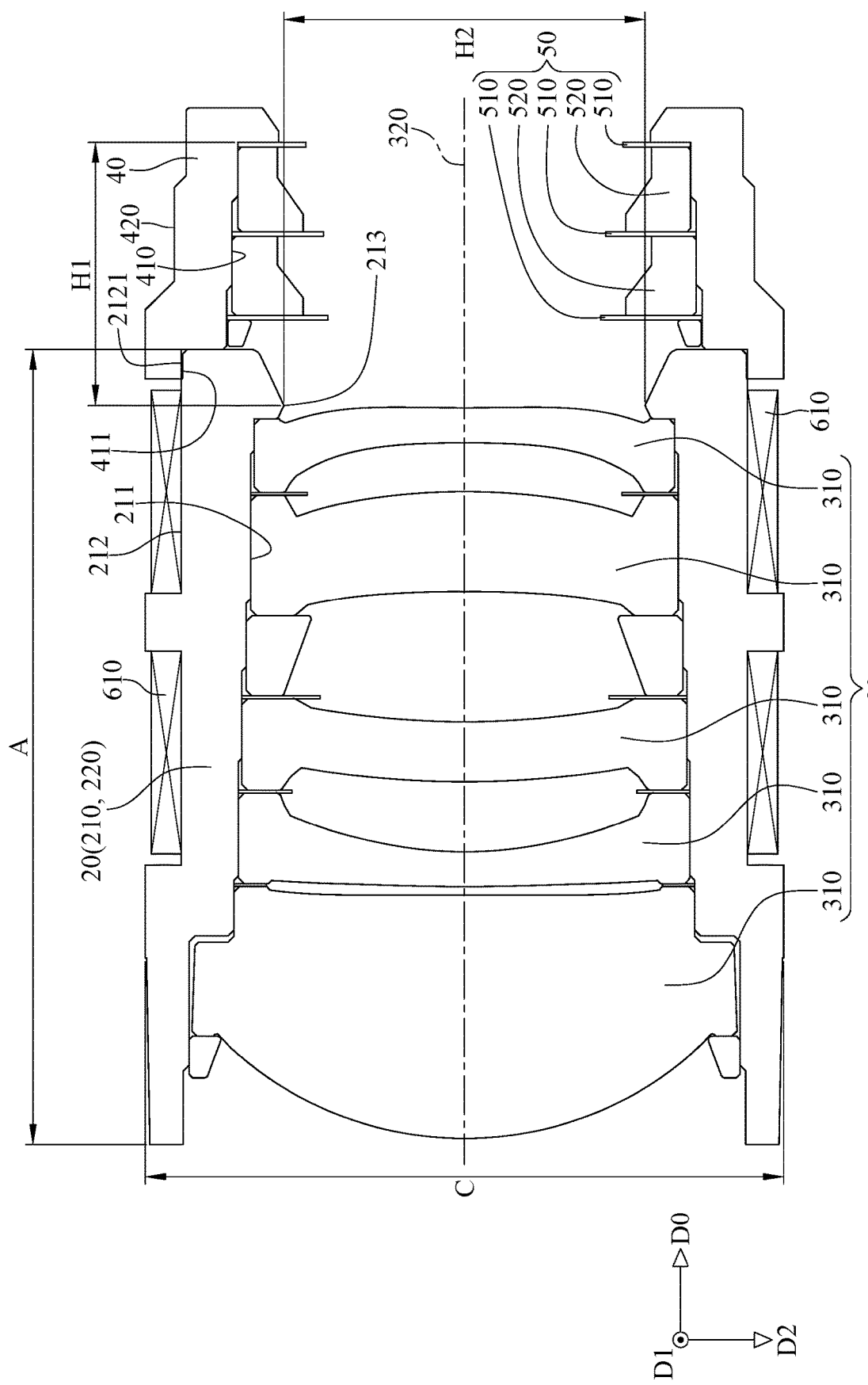
FIG. 5 is a cross-sectional view of the camera module in FIG. 3.

Please refer to FIG. 5. FIG. 5 is a cross-sectional view of the camera module in FIG. 3. A plane in FIG. 3, which is determined by the optical axis direction D0 and the second direction D2, intersects with the camera module 1 and passes through the optical axis 320 so as to obtain the cross-sectional view in FIG. 5. The unitary element 20 further includes a minimal inner opening 213 located between the optical lens assembly 30 and the image-side light blocking assembly 50. A diameter of the minimal inner opening 213 is smaller than an outer diameter of every lens element 310 of the optical lens assembly 30; also, the diameter of the minimal inner opening 213 is smaller than an outer diameter of every element (including the light blocking sheets 510 and the spacing elements 520) of the image-side light blocking assembly 50.

As shown in FIG. 3 and FIG. 5, when a length of the unitary element 20 in the optical axis direction D0 is A, a height of the unitary element 20 in the first direction D1 is B, and a width of the unitary element 20 in the second direction D2 is C, the following condition is satisfied: (C−B)/A=0.09.

As shown in FIG. 4 and FIG. 5, the element outer surface 212 of the unitary element 20 further includes a first contact surface 2121, and the member inner surface 410 of the image-side assembling member 40 includes a second contact surface 411 corresponding to the first contact surface 2121. The first contact surface 2121 contacts the second contact surface 411. In other words, in this embodiment, the element outer surface 212 of the unitary element 20 is connected to the member inner surface 410 of the image-side assembling member 40. Furthermore, a plurality of stripe-shaped structures 2121a are disposed on the first contact surface 2121 of the unitary element 20. Each of the stripe-shaped structures 2121a is in a shape of strip and extends along the optical axis direction D0.

As shown in FIG. 5, with respect to the light blocking sheets 510 of the image-side light blocking assembly 50, one of the light blocking sheets 510 (image-side light blocking sheet) is the closest to the image side. When an axial distance between the image-side light blocking sheet and the minimal inner opening 213 of the unitary element 20 is H1, and the diameter of the minimal inner opening 213 is H2, the following condition is satisfied: H1/H2=0.661.

As shown in FIG. 5, when the number of the lens elements 310 of the optical lens assembly 30 is N, the following condition is satisfied: N=5.

When a maximum field of view of the camera module 1 is FOV, the following condition is satisfied: FOV=21.8 degrees [deg.].

As shown in FIG. 5, with respect to two of the lens elements 310 of the optical lens assembly 30 that are adjacent to each other, one lens element 310 is closer to the object side of the optical lens assembly 30, and the other lens element 310 is closer to the image side of the optical lens assembly 30. A maximum outer diameter of the lens element 310, which is closer to the object side, is larger than a maximum outer diameter of the lens element 310, which is closer to the image side. In other words, the lens elements 310 of the optical lens assembly 30 are arranged with their maximum outer diameters decreasing sequentially from the object side to the image side. The maximum outer diameter of the lens element 310 closest to the object side is the largest among the maximum outer diameters of all lens elements 310, and the maximum outer diameter of the lens element 310 closest to the image side is the smallest among the maximum outer diameters of all lens elements 310.

Figure 6:
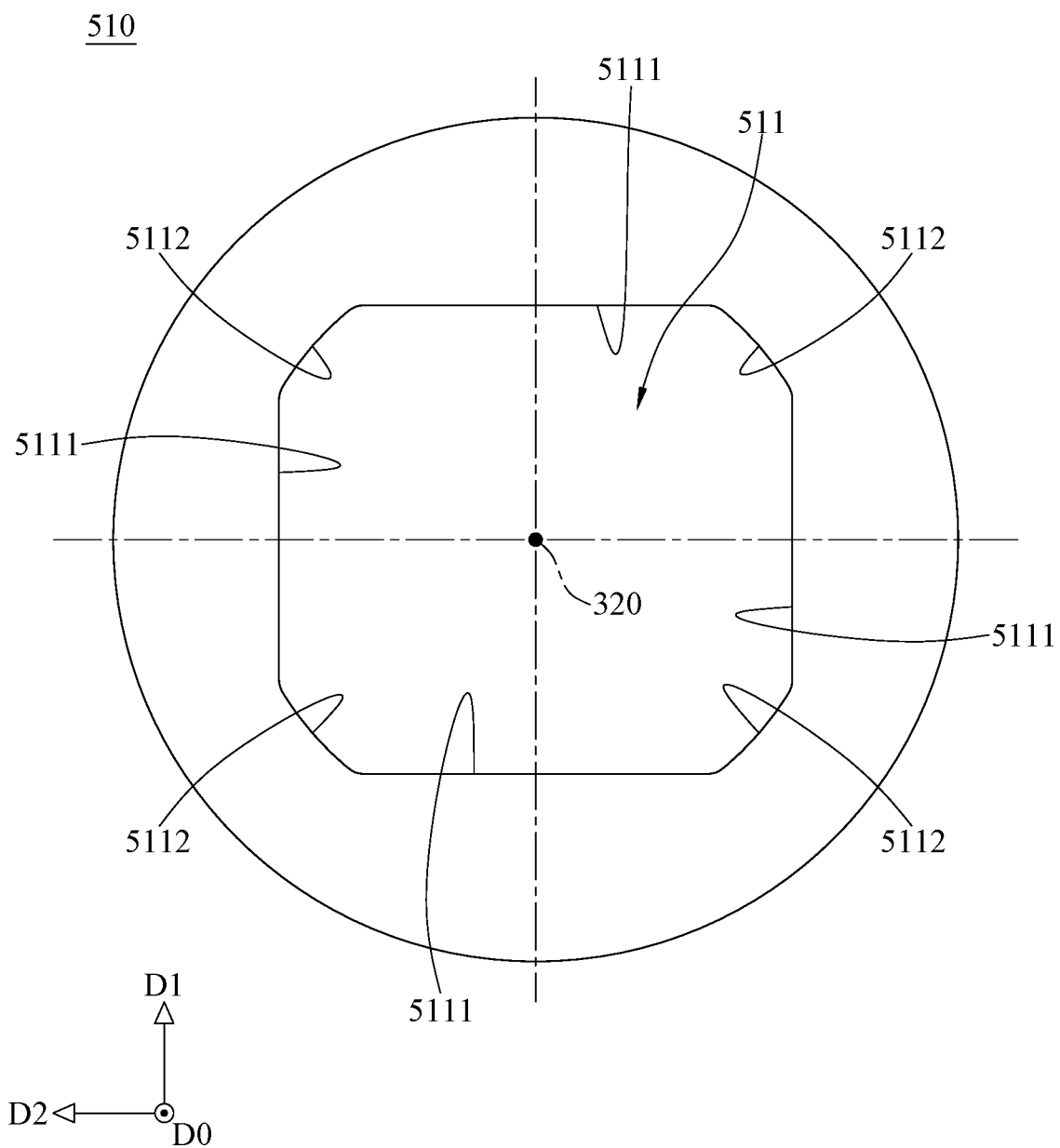
FIG. 6 is a schematic view of a light blocking sheet in FIG. 5.

Please refer to FIG. 6. FIG. 6 is a schematic view of a light blocking sheet in FIG. 5. Each light blocking sheet 510 of the image-side light blocking assembly 50 includes a non-circular opening 511, and the non-circular opening 511 includes four line section parts 5111. The line section parts 5111 are arranged along a circumferential direction of the optical axis 320, and an arc corner 5112 is formed between each of adjacent line section parts 5111.

2nd Embodiment

Figure 7:
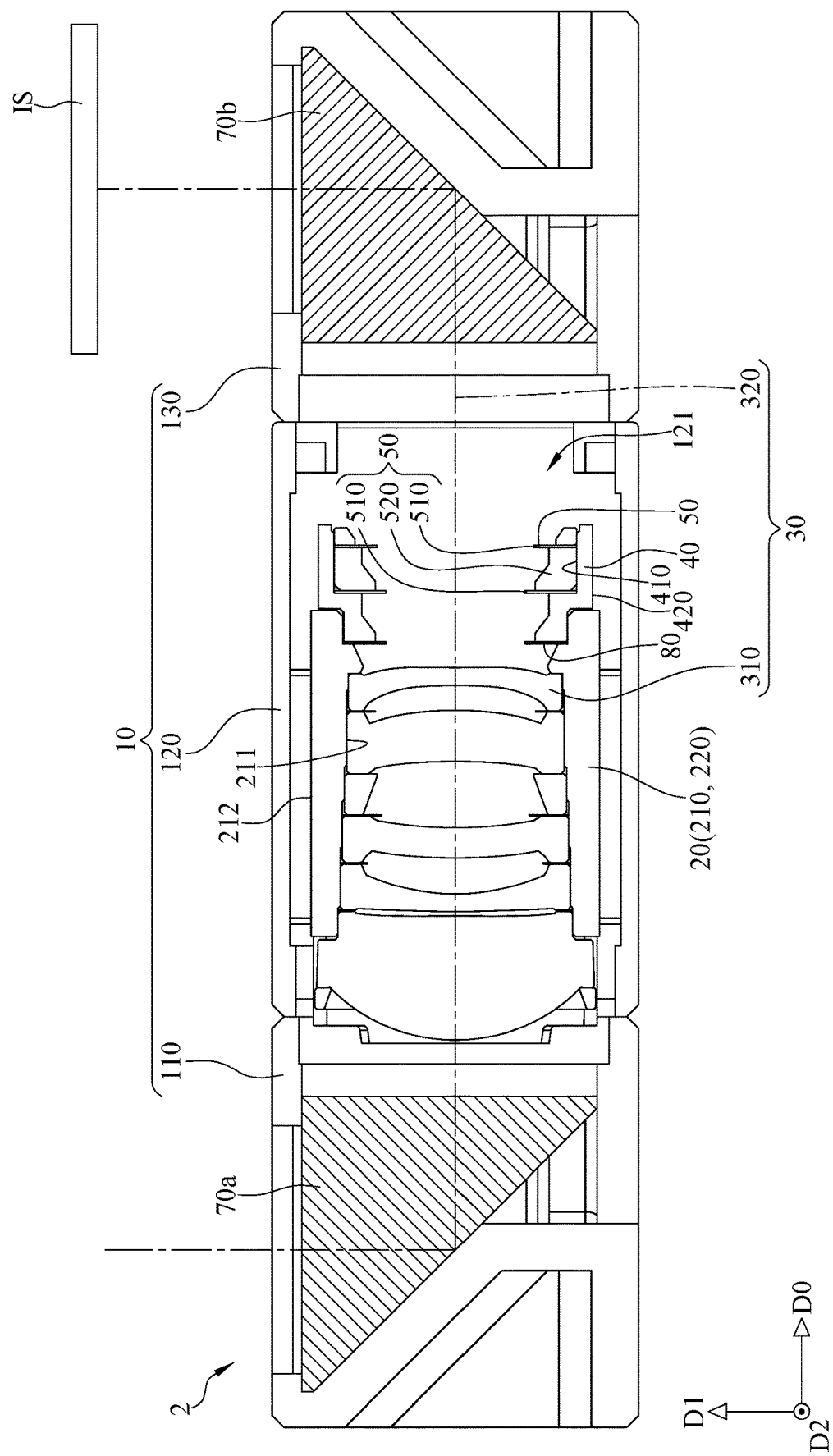
FIG. 7 is a cross-sectional view of an electronic device according to the 2nd embodiment of the present disclosure.
Figure 8:
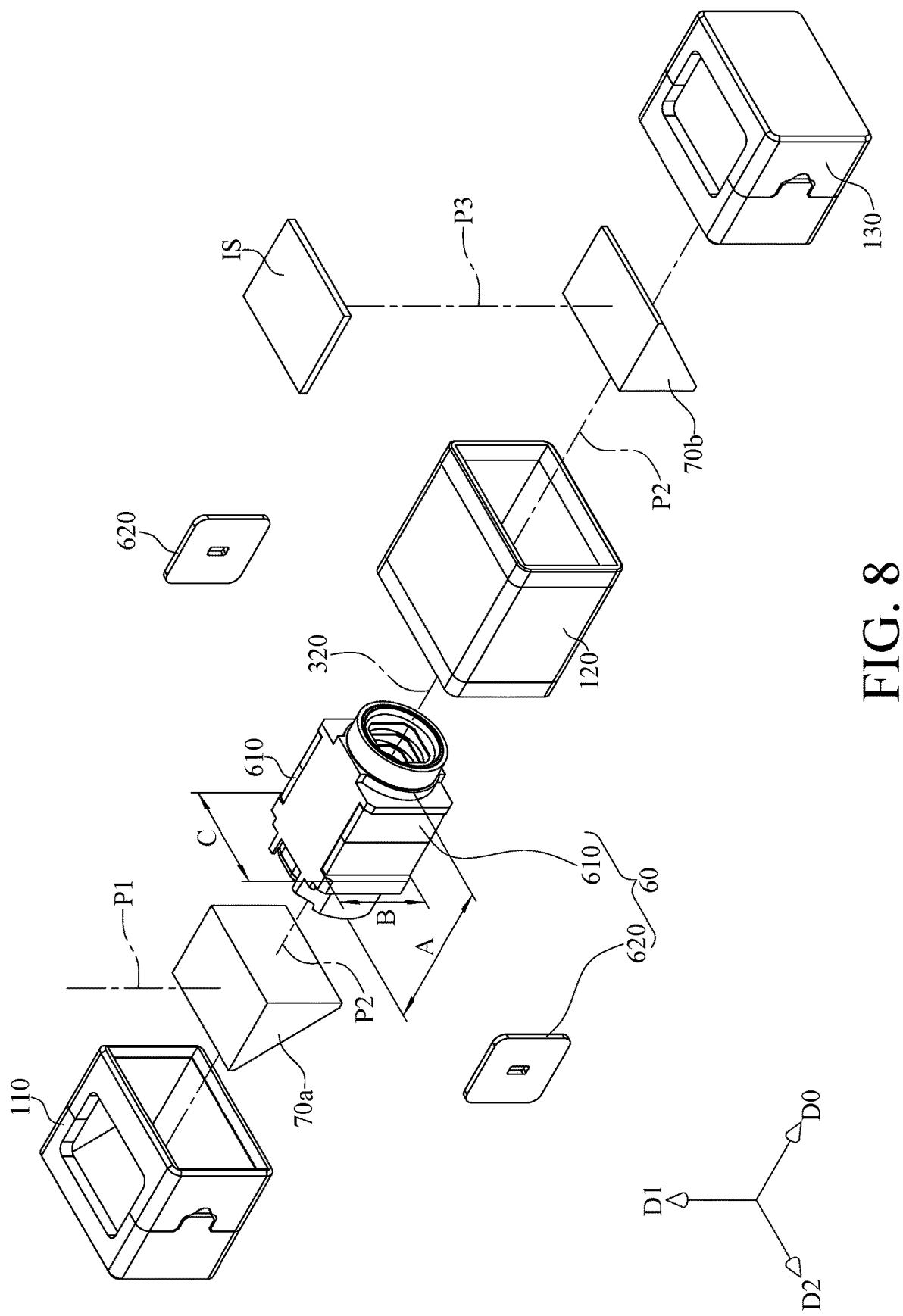
FIG. 8 is an exploded view of the electronic device in FIG. 7.
Figure 9:
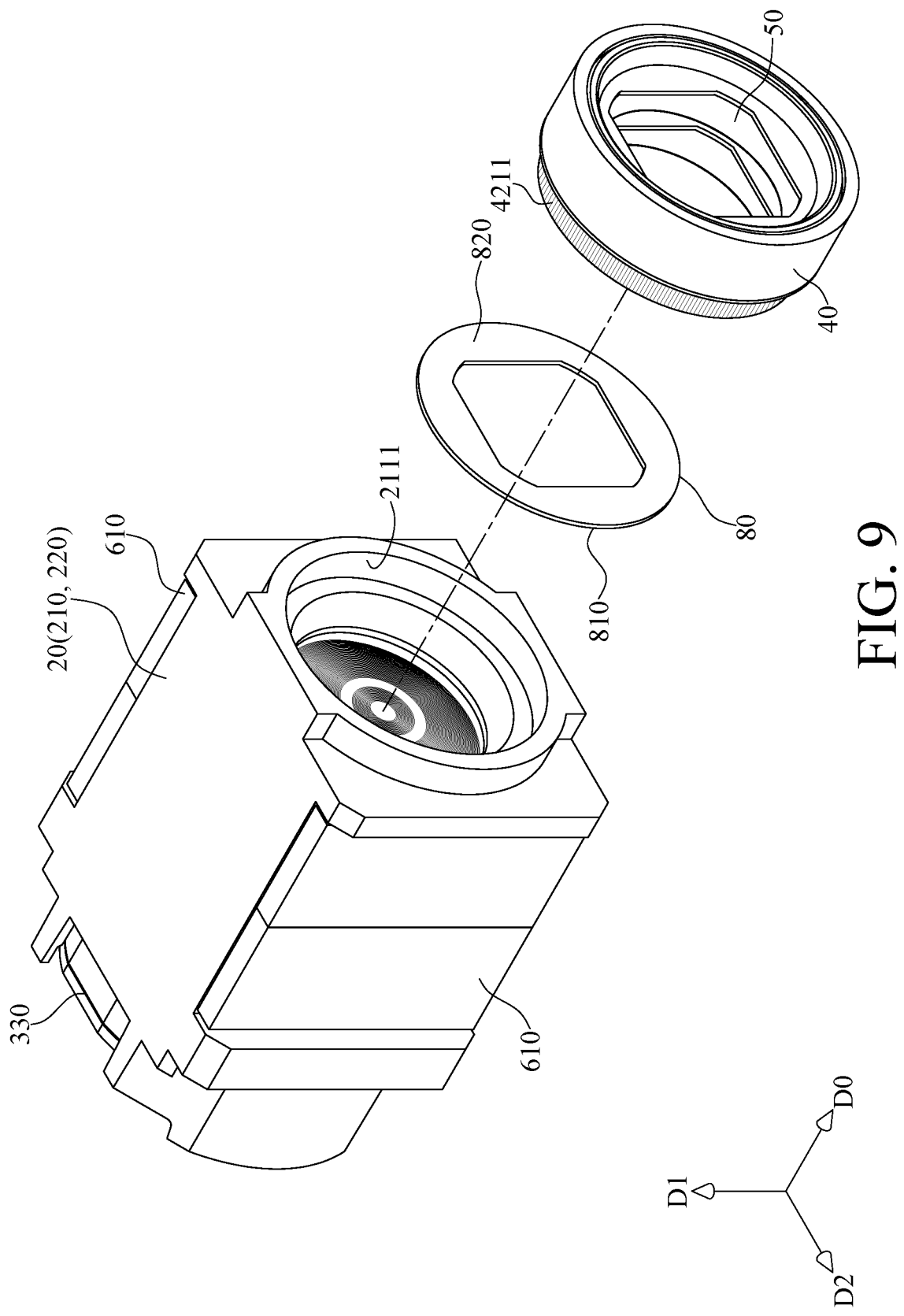
FIG. 9 is an exploded view of a camera module in FIG. 8.

Please refer FIG. 7 through FIG. 9. FIG. 7 is a cross-sectional view of an electronic device according to the 2nd embodiment of the present disclosure. FIG. 8 is an exploded view of the electronic device in FIG. 7. FIG. 9 is an exploded view of a camera module in FIG. 8. In this embodiment, an electronic device includes a camera module 2 and an image sensor IS. The camera module 2 includes a housing 10, a unitary element 20, an optical lens assembly 30, an image-side assembling member 40, an image-side light blocking assembly 50, a driving device 60, a first optical path folding element 70a and a second optical path folding element 70b.

The housing 10 includes a first housing element 110, a second housing element 120 and a third 130. The second housing element 120 is configured to form a housing space 121.

The unitary element 20 is one-piece formed from a lens carrier 210 and a lens barrel 220. The unitary element 20 is movably disposed in the housing space 121 of the second housing element 120. The unitary element 20 includes an element inner surface 211 and an element outer surface 212 opposite to each other.

The optical lens assembly 30 is disposed in the unitary element 20, and the optical lens assembly 30 includes a plurality of lens elements 310. The element inner surface 211 of the unitary element 20 surrounds the optical axis 320 of the optical lens assembly 30, and the element outer surface 212 is farther away from the optical axis 320 than the element inner surface 211.

The image-side assembling member 40 is disposed on the unitary element 20 and close to the image side. The image-side assembling member 40 includes a member inner surface 410 and a member outer surface 420 opposite to each other. The member inner surface 410 surrounds the optical axis 320 of the optical lens assembly 30, and the member outer surface 420 is farther away from the optical axis 320 than the member inner surface 410.

The image-side light blocking assembly 50 is accommodated in the image-side assembling member 40, and the image-side light blocking assembly 50 contacts the image-side assembling member 40. The image-side light blocking assembly 50 includes at least one light blocking sheet 510 and at least one spacing element 520. The light blocking sheet 510 is located on the image side of the optical lens assembly 30, and the light blocking sheet 510 does not contact the optical lens assembly 30. In this embodiment, the image-side light blocking assembly 50 includes a total of two light blocking sheets 510 and one spacing element 520, and the two light blocking sheets 510 are spaced apart by the spacing element 520.

The driving device 60 is disposed between the housing 10 and the unitary element 20. The driving device 60 includes a first driving member 610 and a second driving member 620. The first driving member 610 is disposed on the element outer surface 212 of the unitary element 20, the second driving member 620 is disposed on the second housing element 120 and corresponds to the first driving member 610. In this embodiment, the first driving member 610 includes two magnets respectively disposed on opposite sides of the optical axis 320, and the second driving member 620 includes two coils respectively disposed on opposite sides of the optical axis 320. There is no relative movement among the unitary element 20, the optical lens assembly 30 and the image-side light blocking assembly 50. The electromagnetic force generated by the driving device 60 drives the unitary element 20, the optical lens assembly 30 and the image-side light blocking assembly 50 to move in an optical axis direction D0 parallel to the optical axis 320 of the optical lens assembly 30.

The first optical path folding element 70a is disposed in the first housing element 110 of the housing 10. In detail, the first optical path folding element 70a is disposed between a first optical path P1 and a second optical path P2. The second optical path P2 is parallel to the optical axis 320 of the optical lens assembly 30, and the unitary element 20 is located on the second optical path P2. A first folding angle is formed between the first optical path P1 and the second optical path P2. In this embodiment, the first optical path P1 is perpendicular to the second optical path P2; that is, the first folding angle is a right angle.

The second optical path folding element 70b is disposed in the third housing element 130 of the housing 10. In detail, the second optical path folding element 70b is disposed between the second optical path P2 and a third optical path P3. A second folding angle is formed between the second optical path P2 and the third optical path P3. In this embodiment, the second optical path P2 is perpendicular to the third optical path P3; that is, the second folding angle is a right angle.

As shown in FIG. 8, a first direction D1 and a second direction D2 are defined as two directions orthogonal to the optical axis direction D0, and the first direction D1 is orthogonal to the second direction D2. The image-side assembling member 40 non-overlaps the first driving member 610 of the driving device 60 in the second direction D2. The unitary element 20, the first driving member 610 (magnets) and the second driving member 620 (coils) are in a linear arrangement along the second direction D2.

At least a part of the optical lens assembly 30 non-overlaps the unitary element 20 in the first direction D1. As shown in FIG. 9, an object-side portion 330 of the optical lens assembly 30 non-overlaps the unitary element 20 in the first direction D1.

Figure 10:
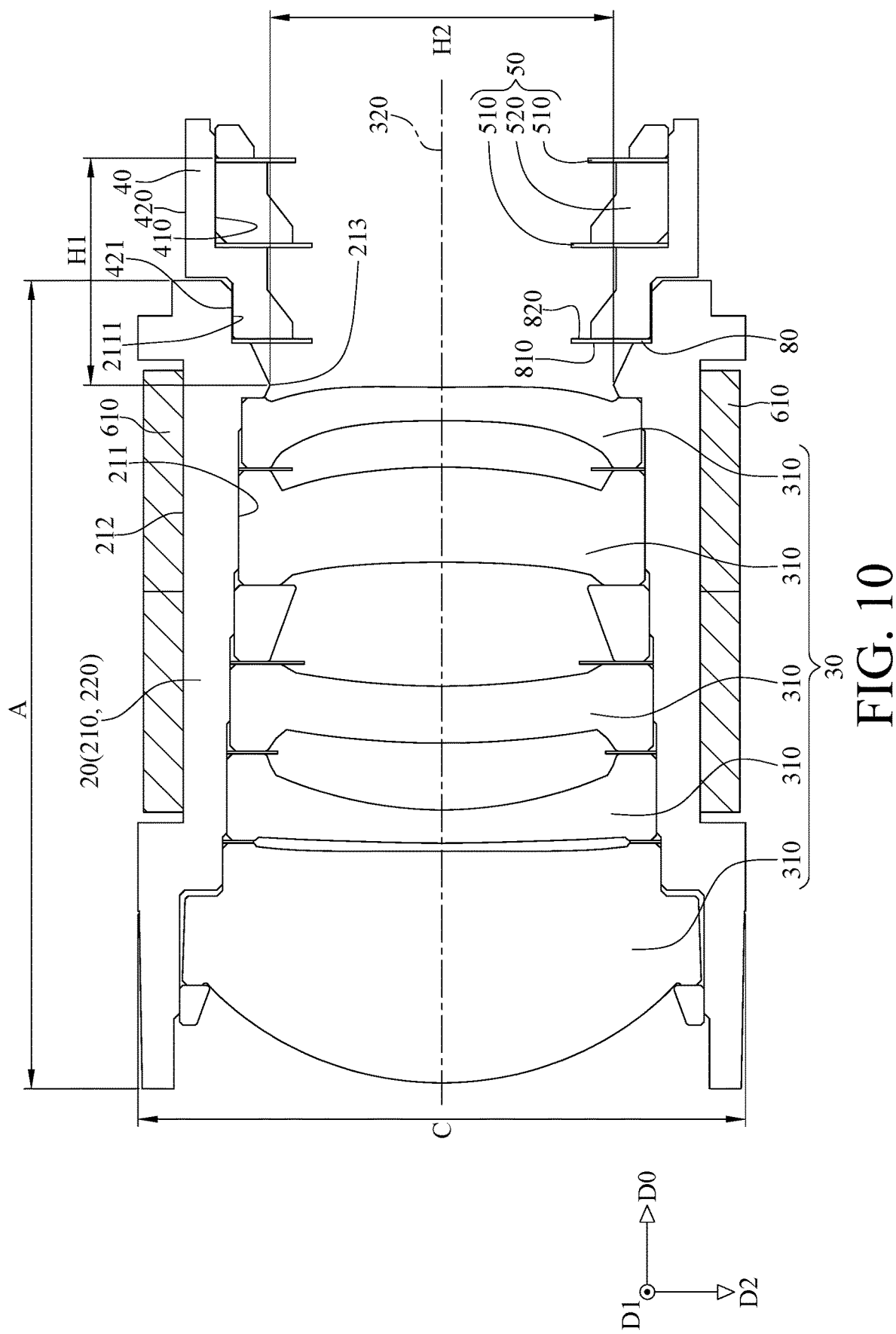
FIG. 10 is a cross-sectional view of the camera module in FIG. 8.

Please refer to FIG. 10, which is a cross-sectional view of the camera module in FIG. 8. A plane in FIG. 8, which is determined by the optical axis direction D0 and the second direction D2, intersects with the camera module 2 and passes through the optical axis 320 so as to obtain the cross-sectional view in FIG. 10. The unitary element 20 further includes a minimal inner opening 213 located between the optical lens assembly 30 and the image-side light blocking assembly 50. A diameter of the minimal inner opening 213 is smaller than an outer diameter of every lens element 310 of the optical lens assembly 30; also, the diameter of the minimal inner opening 213 is smaller than an outer diameter of every element (including the light blocking sheets 510 and the spacing element 520) of the image-side light blocking assembly 50.

As shown in FIG. 8 and FIG. 10, when a length of the unitary element 20 in the optical axis direction D0 is A, a height of the unitary element 20 in the first direction D1 is B, and a width of the unitary element 20 in the second direction D2 is C, the following condition is satisfied: $(C-B)/A = 0.085$.

As shown in FIG. 9 and FIG. 10, in this embodiment, the camera module 2 further includes a light blocking unit 80. The light blocking unit 80 is a light blocking sheet disposed between the minimal inner opening 213 of the unitary element 20 and the image-side assembling member 40. An object-side surface 810 of the light blocking unit 80 is abutted with the unitary element 20, and an image-side surface 820 of the light blocking unit 80 is abutted with the image-side assembling member 40. The minimal inner opening 213 of the unitary element 20, the light blocking unit 80 and the image-side assembling member 40 are arranged in order from the object side to the image side.

As shown in FIG. 9 and FIG. 10, the element inner surface 211 of the unitary element 20 further includes a first contact surface 2111, and the member outer surface 420 of the image-side assembling member 40 includes a second contact surface 421 corresponding to the first contact surface 2111. The first contact surface 2111 contacts the second contact surface 421. In other words, in this embodiment, the element inner surface 211 of the unitary element 20 is connected to the member outer surface 420 of the image-side assembling member 40. Furthermore, a plurality of stripe-shaped structures 4211 are disposed on the second contact surface 421 of the image-side assembling member 40. Each of the stripe-shaped structures 4211 is in a shape of strip and extends along the optical axis direction D0.

As shown in FIG. 10, with respect to the light blocking sheets 510 of the image-side light blocking assembly 50, one of the light blocking sheets 510 (image-side light blocking sheet) is the closest to the image side. When an axial distance between the image-side light blocking sheet and the minimal inner opening 213 of the unitary element 20 is H1, and the diameter of the minimal inner opening 213 is H2, the following condition is satisfied: H1/H2=0.661.

As shown in FIG. 10, when the number of the lens elements 310 of the optical lens assembly 30 is N, the following condition is satisfied: N=5.

When a maximum field of view of the camera module 2 is FOV, the following condition is satisfied: FOV=21.8 [deg.].

As shown in FIG. 10, with respect to two of the lens elements 310 of the optical lens assembly 30 that are adjacent to each other, one lens element 310 is closer to the object side of the optical lens assembly 30, and the other lens element 310 is closer to the image side of the optical lens assembly 30. A maximum outer diameter of the lens element 310, which is closer to the object side, is larger than a maximum outer diameter of the lens element 310, which is closer to the image side. In other words, the lens elements 310 of the optical lens assembly 30 are arranged with their maximum outer diameters decreasing sequentially from the object side to the image side. The maximum outer diameter of the lens element 310 closest to the object side is the largest among the maximum outer diameters of all lens elements 310, and the maximum outer diameter of the lens element 310 closest to the image side is the smallest among the maximum outer diameters of all lens elements 310.

3rd Embodiment

Figure 11:
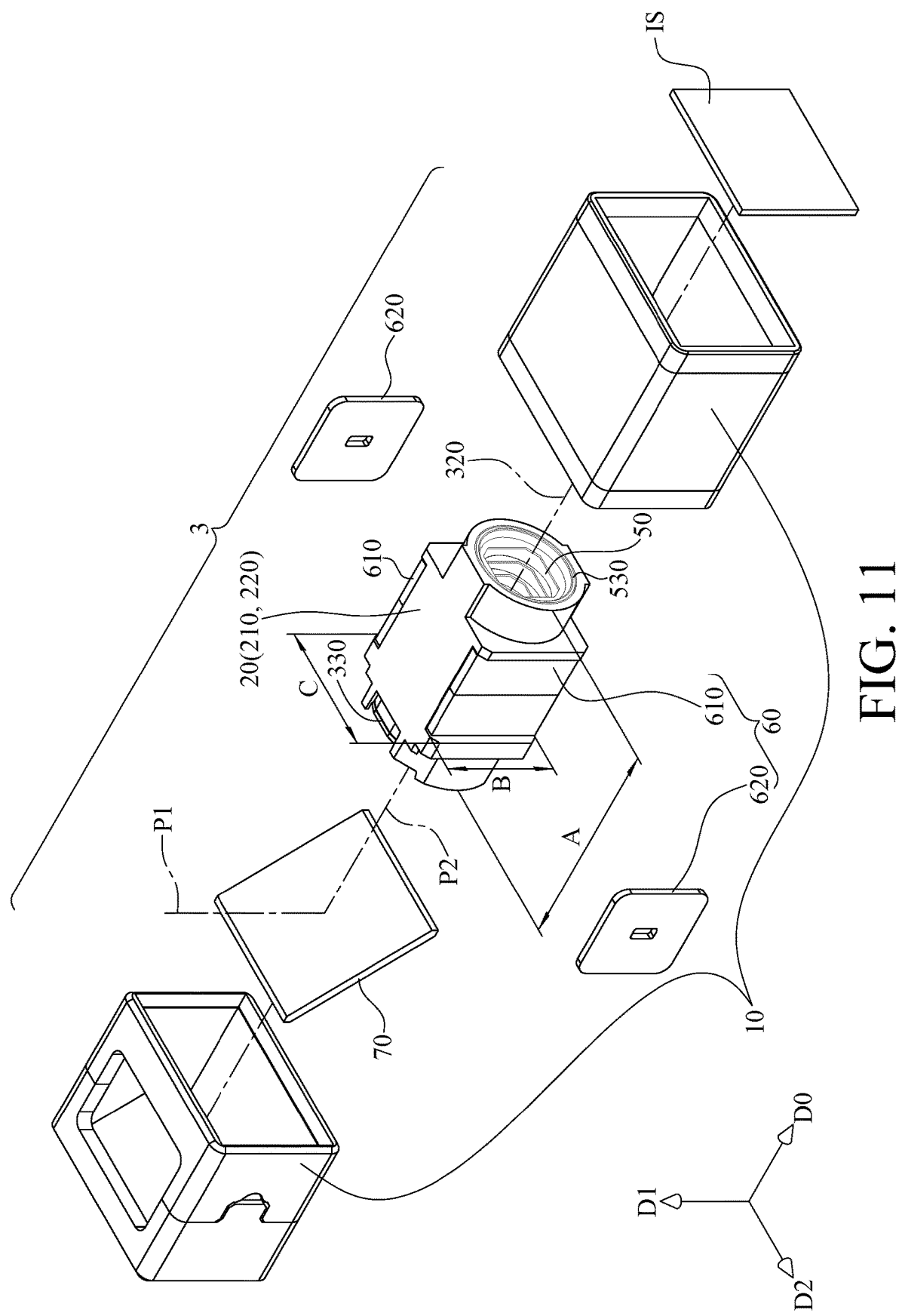
FIG. 11 is an exploded view of an electronic device according to the 3rd embodiment of the present disclosure.
Figure 12:
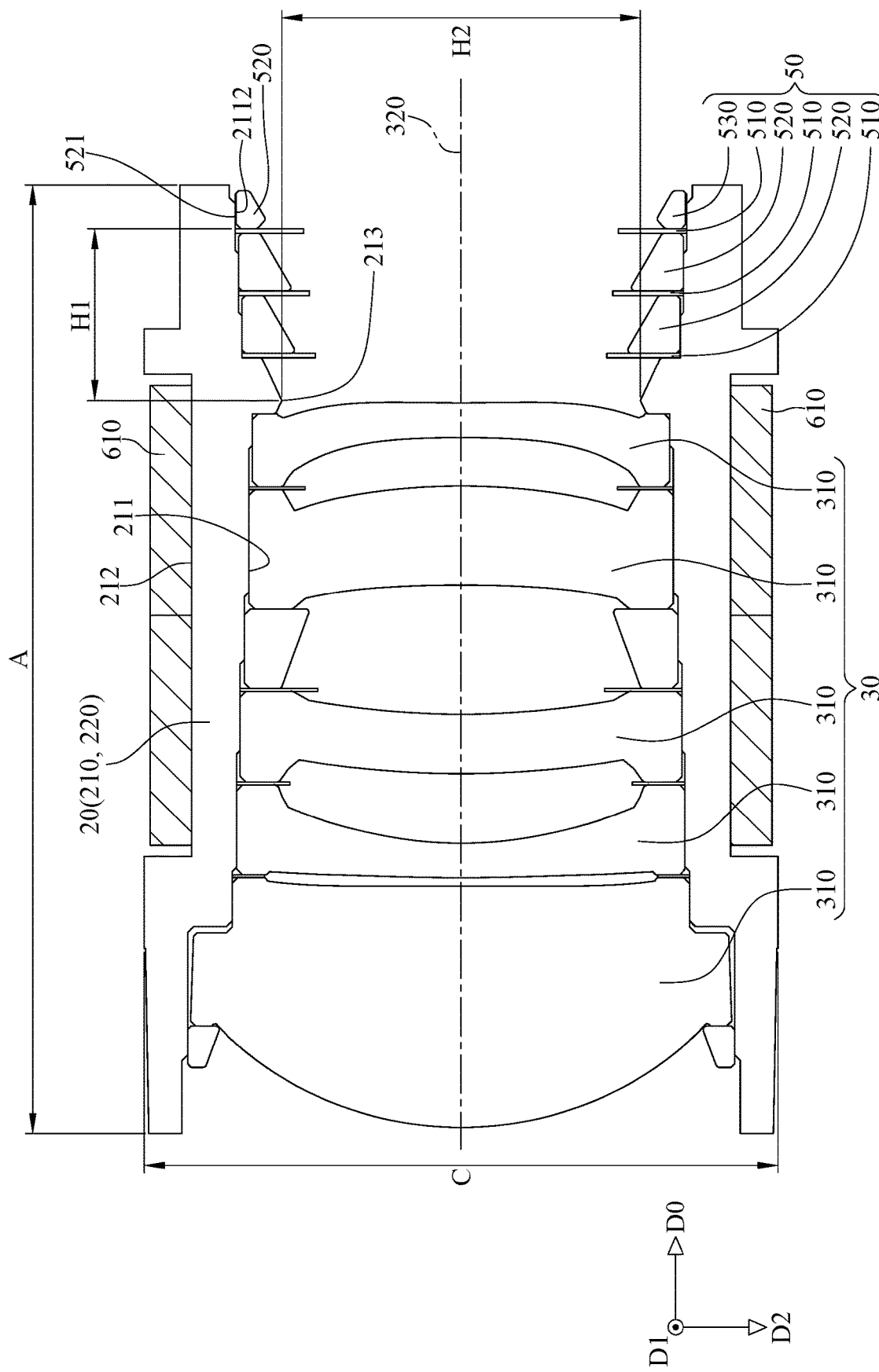
FIG. 12 is a cross-sectional view of a camera module in FIG. 11.
Figure 13:
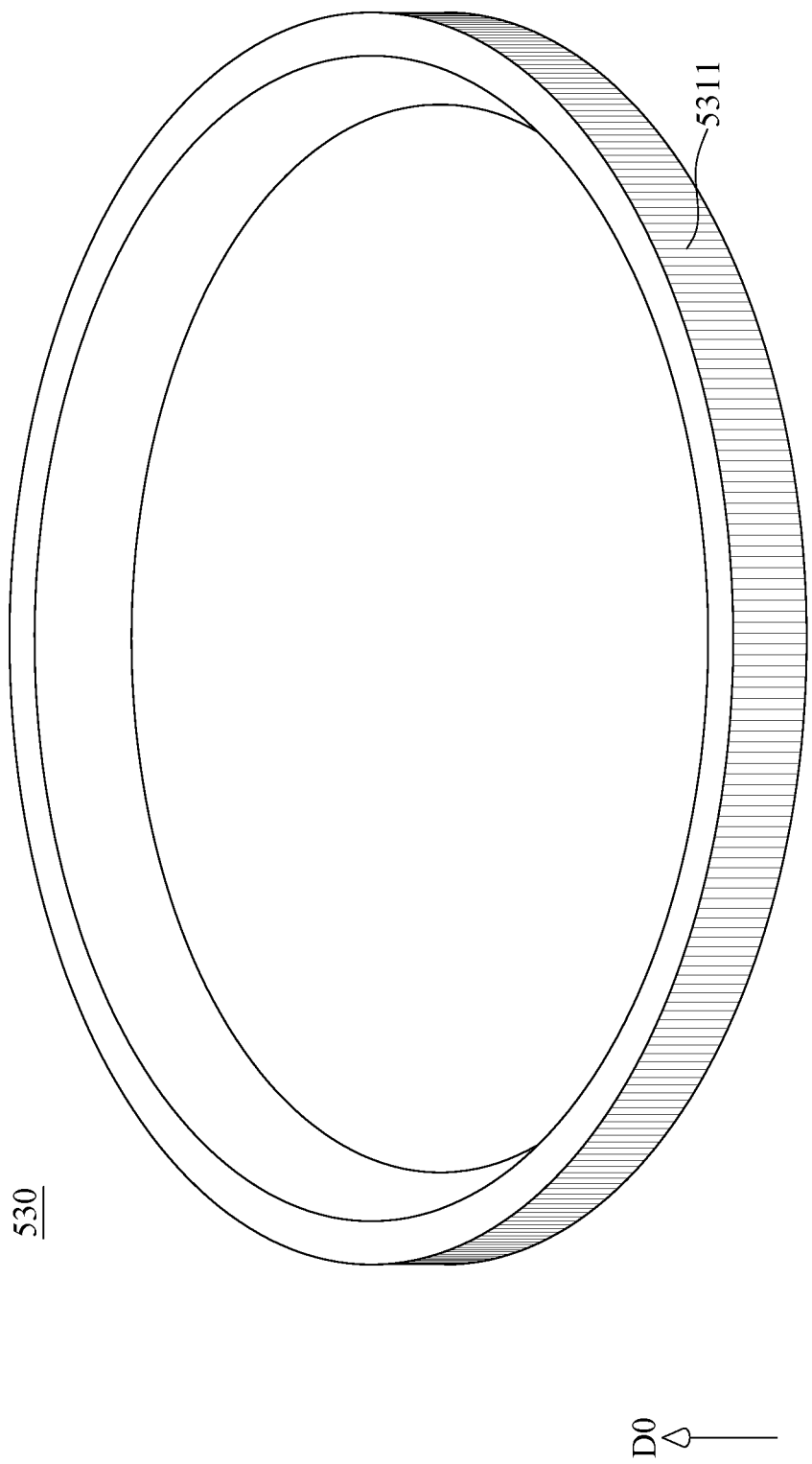
FIG. 13 is a perspective view of a retaining element of an image-side light blocking assembly in FIG. 12.

Please refer to FIG. 11 through FIG. 13. FIG. 11 is an exploded view of an electronic device according to the 3rd embodiment of the present disclosure. FIG. 12 is a cross-sectional view of a camera module in FIG. 11. FIG. 13 is a perspective view of a retaining element of an image-side light blocking assembly in FIG. 12. In this embodiment, an electronic device includes a camera module 3 and an image sensor IS. The camera module 3 includes a housing 10, a unitary element 20, an optical lens assembly 30, an image-side light blocking assembly 50, a driving device 60 and an optical path folding element 70.

The unitary element 20 is one-piece formed from a lens carrier 210 and a lens barrel 220. The unitary element 20 is movably disposed in the housing 10. The unitary element 20 includes an element inner surface 211 and an element outer surface 212 opposite to each other.

The optical lens assembly 30 is disposed in the unitary element 20, and the optical lens assembly 30 includes a plurality of lens elements 310. The element inner surface 211 of the unitary element 20 surrounds the optical axis 320 of the optical lens assembly 30, and the element outer surface 212 is farther away from the optical axis 320 than the element inner surface 211.

The image-side light blocking assembly 50 is accommodated in the unitary element 20, and the image-side light blocking assembly 50 contacts the unitary element 20. The image-side light blocking assembly 50 includes at least one light blocking sheet 510 and at least one spacing element 520. The light blocking sheet 510 is located on the image side of the optical lens assembly 30, and the light blocking sheet 510 does not contact the optical lens assembly 30. In this embodiment, the image-side light blocking assembly 50 includes a total of three light blocking sheets 510 and two spacing elements 520. The light blocking sheets 510 and the spacing elements 520 are arranged in a staggered manner.

The driving device 60 is disposed between the housing 10 and the unitary element 20. The driving device 60 includes a first driving member 610 and a second driving member 620. The first driving member 610 is disposed on the element outer surface 212 of the unitary element 20, the second driving member 620 is disposed in a housing space of the housing 10 and corresponds to the first driving member 610. There is no relative movement among the unitary element 20, the optical lens assembly 30 and the image-side light blocking assembly 50. The electromagnetic force generated by the driving device 60 drives the unitary element 20, the optical lens assembly 30 and the image-side light blocking assembly 50 to move in an optical axis direction D0 parallel to the optical axis 320 of the optical lens assembly 30.

The optical path folding element 70 is disposed in the housing 10. In detail, the optical path folding element 70 is disposed between a first optical path P1 and a second optical path P2. The second optical path P2 is parallel to the optical axis 320 of the optical lens assembly 30, and the unitary element 20 is located on the second optical path P2. A first folding angle is formed between the first optical path P1 and the second optical path P2. In this embodiment, the first optical path P1 is perpendicular to the second optical path P2; that is, the first folding angle is a right angle.

In this embodiment, the image-side light blocking assembly 50 further includes a retaining element 530, and the image-side light blocking assembly 50 is positioned in the unitary element 20 by the retaining element 530. In detail, the element inner surface 211 of the unitary element 20 includes a third contact surface 2112, and the retaining element 530 includes a fourth contact surface 531 corresponding to the third contact surface 2112. The third contact surface 2112 contacts the fourth contact surface 531. In other words, in this embodiment, the element inner surface 211 of the unitary element 20 is connected to the inner surface of the retaining element 530.

As shown in FIG. 13, a plurality of stripe-shaped structures 5311 are disposed on the fourth contact surface 531 of the retaining element 530. Each of the stripe-shaped structures 5311 is in a shape of strip and extends along the optical axis direction D0.

As shown in FIG. 12, the unitary element 20 further includes a minimal inner opening 213 located between the optical lens assembly 30 and the image-side light blocking assembly 50. A diameter of the minimal inner opening 213 is smaller than an outer diameter of every lens element 310 of the optical lens assembly 30; also, the diameter of the minimal inner opening 213 is smaller than an outer diameter of every element (including the light blocking sheets 510 and the spacing elements 520) of the image-side light blocking assembly 50.

As shown in FIG. 11 and FIG. 12, a first direction D1 and a second direction D2 are defined as two directions orthogonal to the optical axis direction D0, and the first direction D1 is orthogonal to the second direction D2. when a length of the unitary element 20 in the optical axis direction D0 is A, a height of the unitary element 20 in the first direction D1 is B, and a width of the unitary element 20 in the second direction D2 is C, the following condition is satisfied: (C−B)/A=0.075.

At least a part of the optical lens assembly 30 non-overlaps the unitary element 20 in the first direction D1. As shown in FIG. 11, an object-side portion 330 of the optical lens assembly 30 non-overlaps the unitary element 20 in the first direction D1.

As shown in FIG. 12, with respect to the light blocking sheets 510 of the image-side light blocking assembly 50, one of the light blocking sheets 510 (image-side light blocking sheet) is the closest to the image side. When an axial distance between the image-side light blocking sheet and the minimal inner opening 213 of the unitary element 20 is H1, and the diameter of the minimal inner opening 213 is H2, the following condition is satisfied: H1/H2=0.481.

As shown in FIG. 12, when the number of the lens elements 310 of the optical lens assembly 30 is N, the following condition is satisfied: N=5.

When a maximum field of view of the camera module 3 is FOV, the following condition is satisfied: FOV=21.8 [deg.].

As shown in FIG. 12, with respect to two of the lens elements 310 of the optical lens assembly 30 that are adjacent to each other, one lens element 310 is closer to the object side of the optical lens assembly 30, and the other lens element 310 is closer to the image side of the optical lens assembly 30. A maximum outer diameter of the lens element 310, which is closer to the object side, is larger than a maximum outer diameter of the lens element 310, which is closer to the image side. In other words, the lens elements 310 of the optical lens assembly 30 are arranged with their maximum outer diameters decreasing sequentially from the object side to the image side. The maximum outer diameter of the lens element 310 closest to the object side is the largest among the maximum outer diameters of all lens elements 310, and the maximum outer diameter of the lens element 310 closest to the image side is the smallest among the maximum outer diameters of all lens elements 310.

4th Embodiment

Figure 14:
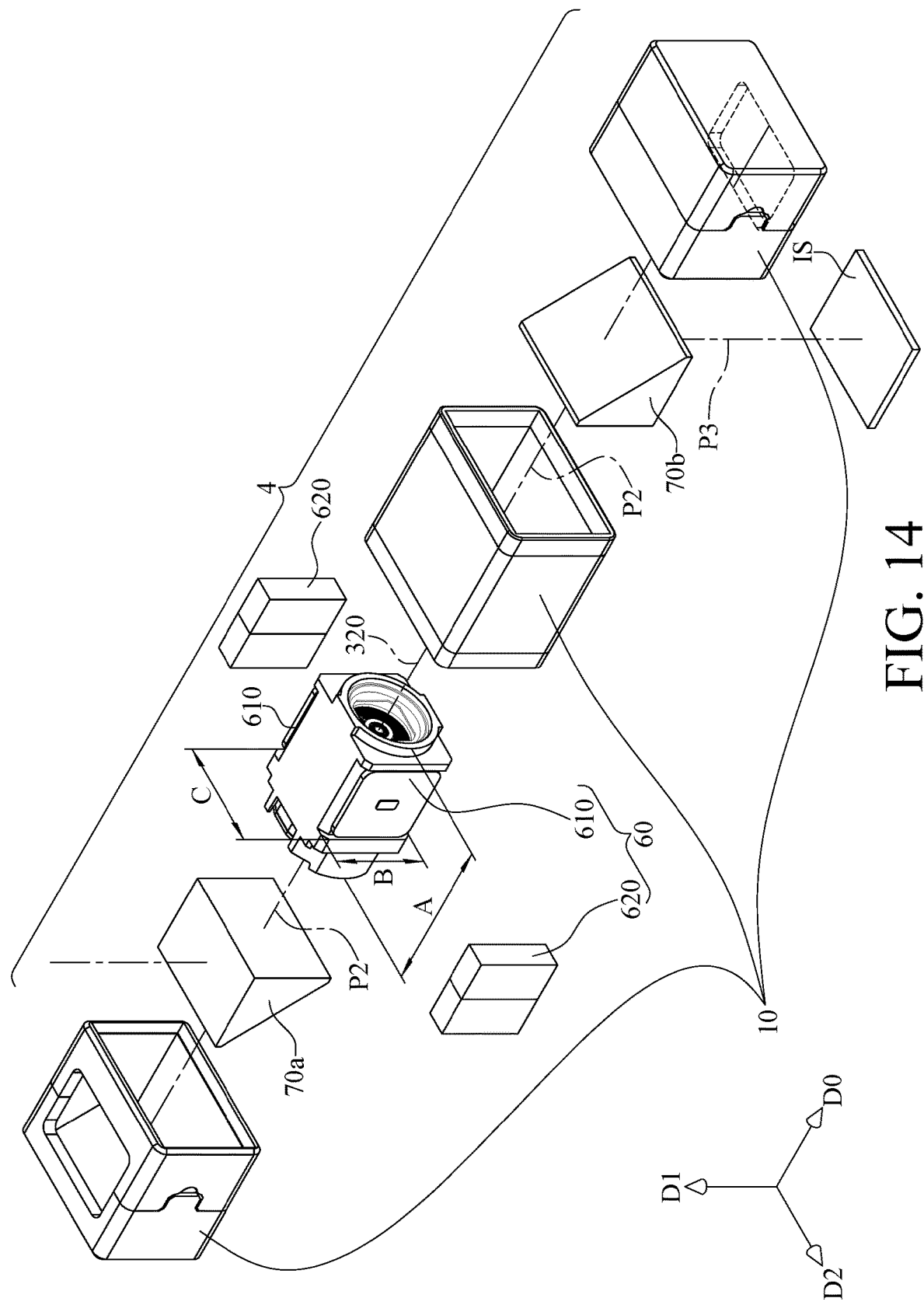
FIG. 14 is an exploded view of an electronic device according to the 4th embodiment of the present disclosure.
Figure 15:
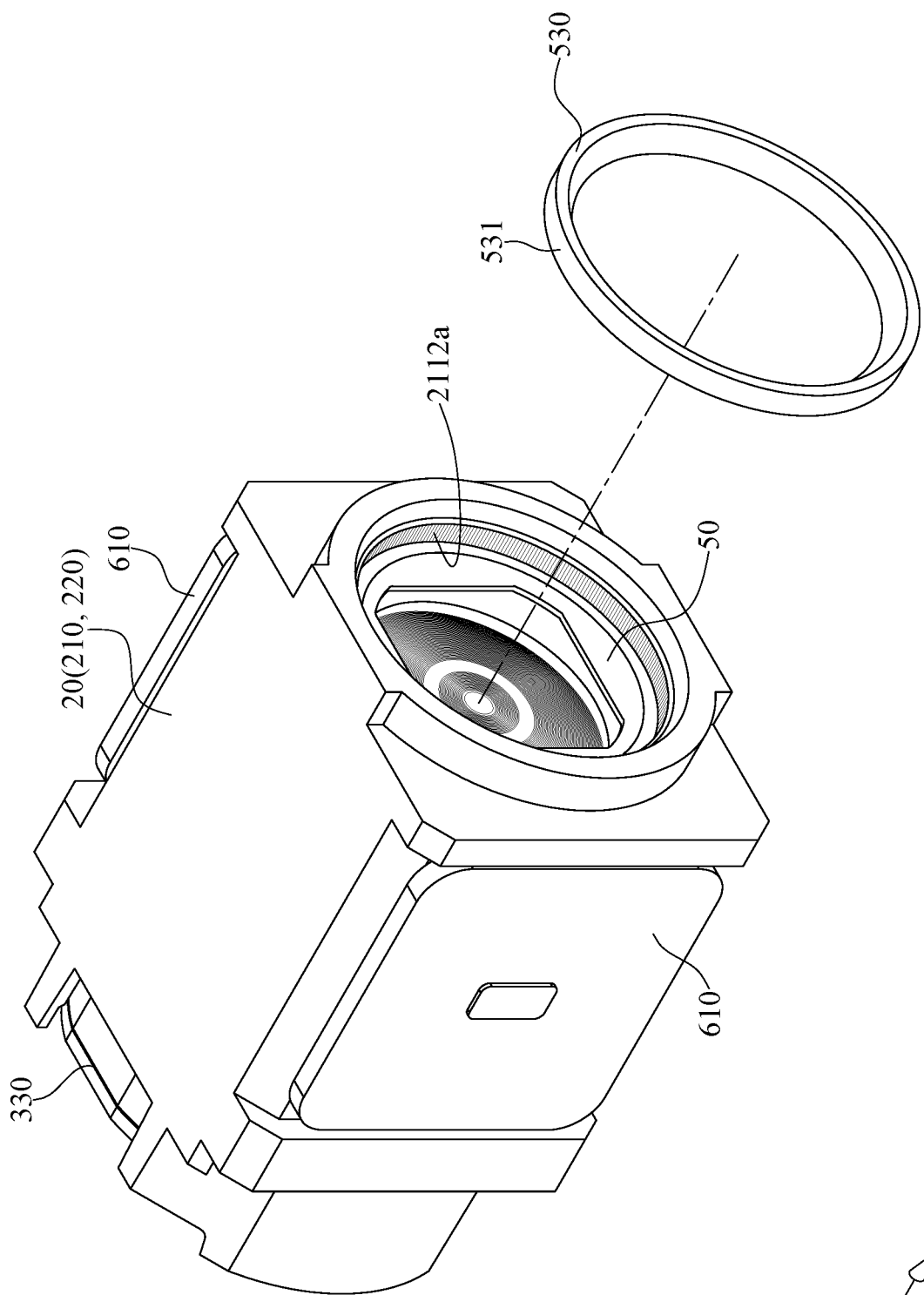
FIG. 15 is an exploded view of a camera module in FIG. 14.
Figure 16:
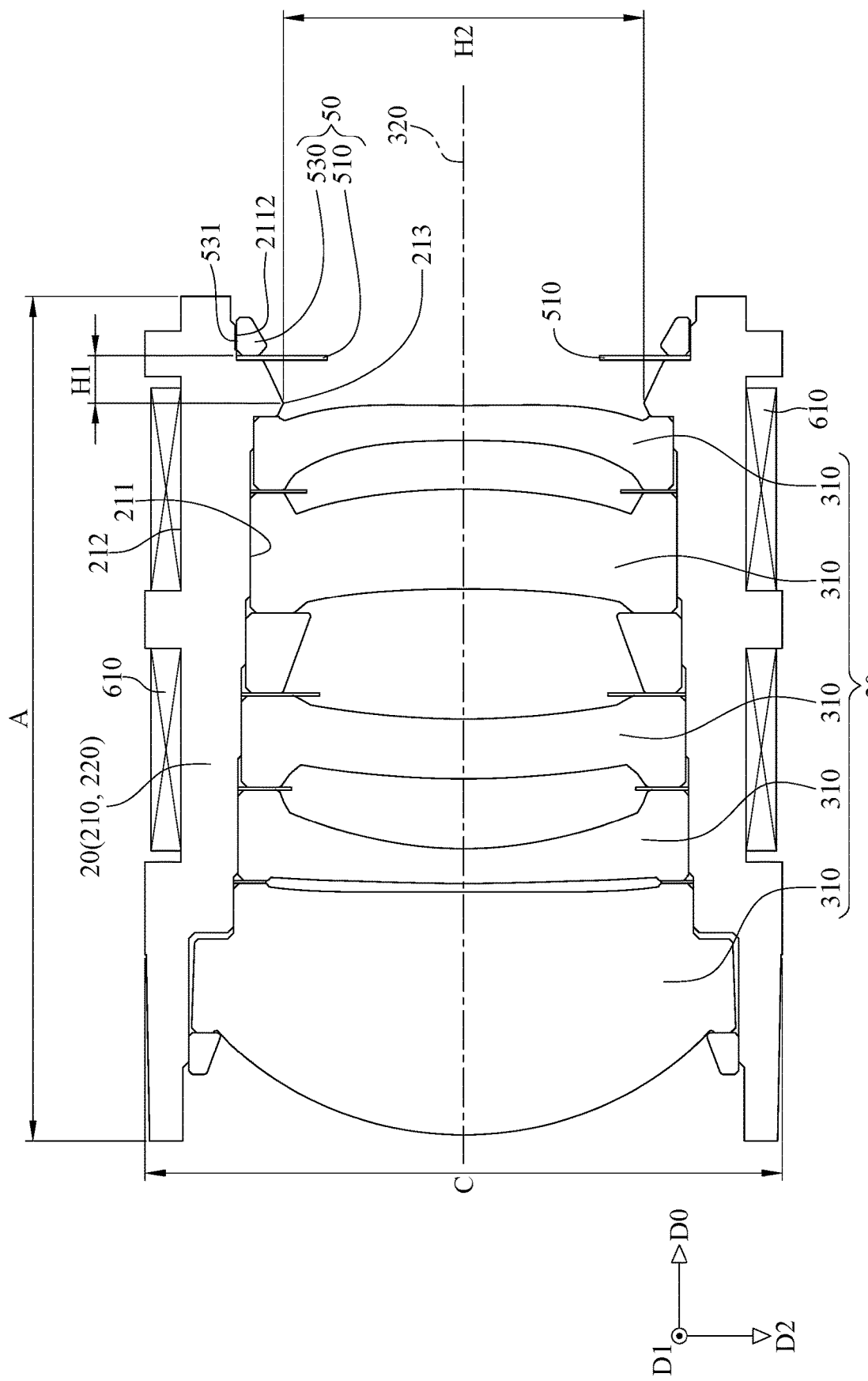
FIG. 16 is a cross-sectional view of the camera module in FIG. 14.

Please refer to FIG. 14 through FIG. 16. FIG. 14 is an exploded view of an electronic device according to the 4th embodiment of the present disclosure. FIG. 15 is an exploded view of a camera module in FIG. 14. FIG. 16 is a cross-sectional view of the camera module in FIG. 14. In this embodiment, an electronic device includes a camera module 4 and an image sensor IS. The camera module 4 includes a housing 10, a unitary element 20, an optical lens assembly 30, an image-side light blocking assembly 50, a driving device 60, a first optical path folding element 70a and a second optical path folding element 70b.

The unitary element 20 is one-piece formed from a lens carrier 210 and a lens barrel 220. The unitary element 20 is movably disposed in the housing 10. The unitary element 20 includes an element inner surface 211 and an element outer surface 212 opposite to each other.

The optical lens assembly 30 is disposed in the unitary element 20, and the optical lens assembly 30 includes a plurality of lens elements 310. The element inner surface 211 of the unitary element 20 surrounds the optical axis 320 of the optical lens assembly 30, and the element outer surface 212 is farther away from the optical axis 320 than the element inner surface 211.

The image-side light blocking assembly 50 is accommodated in the unitary element 20, and the image-side light blocking assembly 50 contacts the unitary element 20. The image-side light blocking assembly 50 includes at least one light blocking sheet 510 located on the image side of the optical lens assembly 30, and the light blocking sheet 510 does not contact the optical lens assembly 30. In this embodiment, the image-side light blocking assembly 50 includes one single light blocking sheet 510.

The driving device 60 is disposed between the housing 10 and the unitary element 20. The driving device 60 includes a first driving member 610 and a second driving member 620. The first driving member 610 is disposed on the element outer surface 212 of the unitary element 20, the second driving member 620 is disposed in a housing space of the housing 10 and corresponds to the first driving member 610. There is no relative movement among the unitary element 20, the optical lens assembly 30 and the image-side light blocking assembly 50. The electromagnetic force generated by the driving device 60 drives the unitary element 20, the optical lens assembly 30 and the image-side light blocking assembly 50 to move in an optical axis direction D0 parallel to the optical axis 320 of the optical lens assembly 30.

The first optical path folding element 70a is disposed in the housing 10. In detail, the first optical path folding element 70a is disposed between a first optical path P1 and a second optical path P2. The second optical path P2 is parallel to the optical axis 320 of the optical lens assembly 30, and the unitary element 20 is located on the second optical path P2. A first folding angle is formed between the first optical path P1 and the second optical path P2. In this embodiment, the first optical path P1 is perpendicular to the second optical path P2; that is, the first folding angle is a right angle.

The second optical path folding element 70b is disposed in the housing 10. In detail, the second optical path folding element 70b is disposed between the second optical path P2 and a third optical path P3. A second folding angle is formed between the second optical path P2 and the third optical path P3. In this embodiment, the second optical path P2 is perpendicular to the third optical path P3; that is, second first folding angle is a right angle.

In this embodiment, the image-side light blocking assembly 50 further includes a retaining element 530, and the image-side light blocking assembly 50 is positioned in the unitary element 20 by the retaining element 530. In detail, the element inner surface 211 of the unitary element 20 includes a third contact surface 2112, and the retaining element 530 includes a fourth contact surface 531 corresponding to the third contact surface 2112. The third contact surface 2112 contacts the fourth contact surface 531. In other words, in this embodiment, the element inner surface 211 of the unitary element 20 is connected to the inner surface of the retaining element 530.

As shown in FIG. 15, a plurality of stripe-shaped structures 2112a are disposed on the third contact surface 2112 of the unitary element 20. Each of the stripe-shaped structures 2112a is in a shape of strip and extends along the optical axis direction D0.

As shown in FIG. 16, the unitary element 20 further includes a minimal inner opening 213 located between the optical lens assembly 30 and the image-side light blocking assembly 50. A diameter of the minimal inner opening 213 is smaller than an outer diameter of every lens element 310 of the optical lens assembly 30; also, the diameter of the minimal inner opening 213 is smaller than an outer diameter of every element (including the light blocking sheets 510 and the retaining element 530) of the image-side light blocking assembly 50.

As shown in FIG. 14 and FIG. 16, a first direction D1 and a second direction D2 are defined as two directions orthogonal to the optical axis direction D0, and the first direction D1 is orthogonal to the second direction D2. When a length of the unitary element 20 in the optical axis direction D0 is A, a height of the unitary element 20 in the first direction D1 is B, and a width of the unitary element 20 in the second direction D2 is C, the following condition is satisfied: (C−B)/A=0.085.

At least a part of the optical lens assembly 30 non-overlaps the unitary element 20 in the first direction D1. As shown in FIG. 14, an object-side portion 330 of the optical lens assembly 30 non-overlaps the unitary element 20 in the first direction D1.

As shown in FIG. 16, when an axial distance between the light blocking sheet 510 and the minimal inner opening 213 of the unitary element 20 is H1, and the diameter of the minimal inner opening 213 is H2, the following condition is satisfied: H1/H2=0.133.

As shown in FIG. 16, when the number of the lens elements 310 of the optical lens assembly 30 is N, the following condition is satisfied: N=5.

When a maximum field of view of the camera module 4 is FOV, the following condition is satisfied: FOV=21.8 [deg.].

As shown in FIG. 16, with respect to two of the lens elements 310 of the optical lens assembly 30 that are adjacent to each other, one lens element 310 is closer to the object side of the optical lens assembly 30, and the other lens element 310 is closer to the image side of the optical lens assembly 30. A maximum outer diameter of the lens element 310, which is closer to the object side, is larger than a maximum outer diameter of the lens element 310, which is closer to the image side. In other words, the lens elements 310 of the optical lens assembly 30 are arranged with their maximum outer diameters decreasing sequentially from the object side to the image side. The maximum outer diameter of the lens element 310 closest to the object side is the largest among the maximum outer diameters of all lens elements 310, and the maximum outer diameter of the lens element 310 closest to the image side is the smallest among the maximum outer diameters of all lens elements 310.

5th Embodiment

Figure 17:
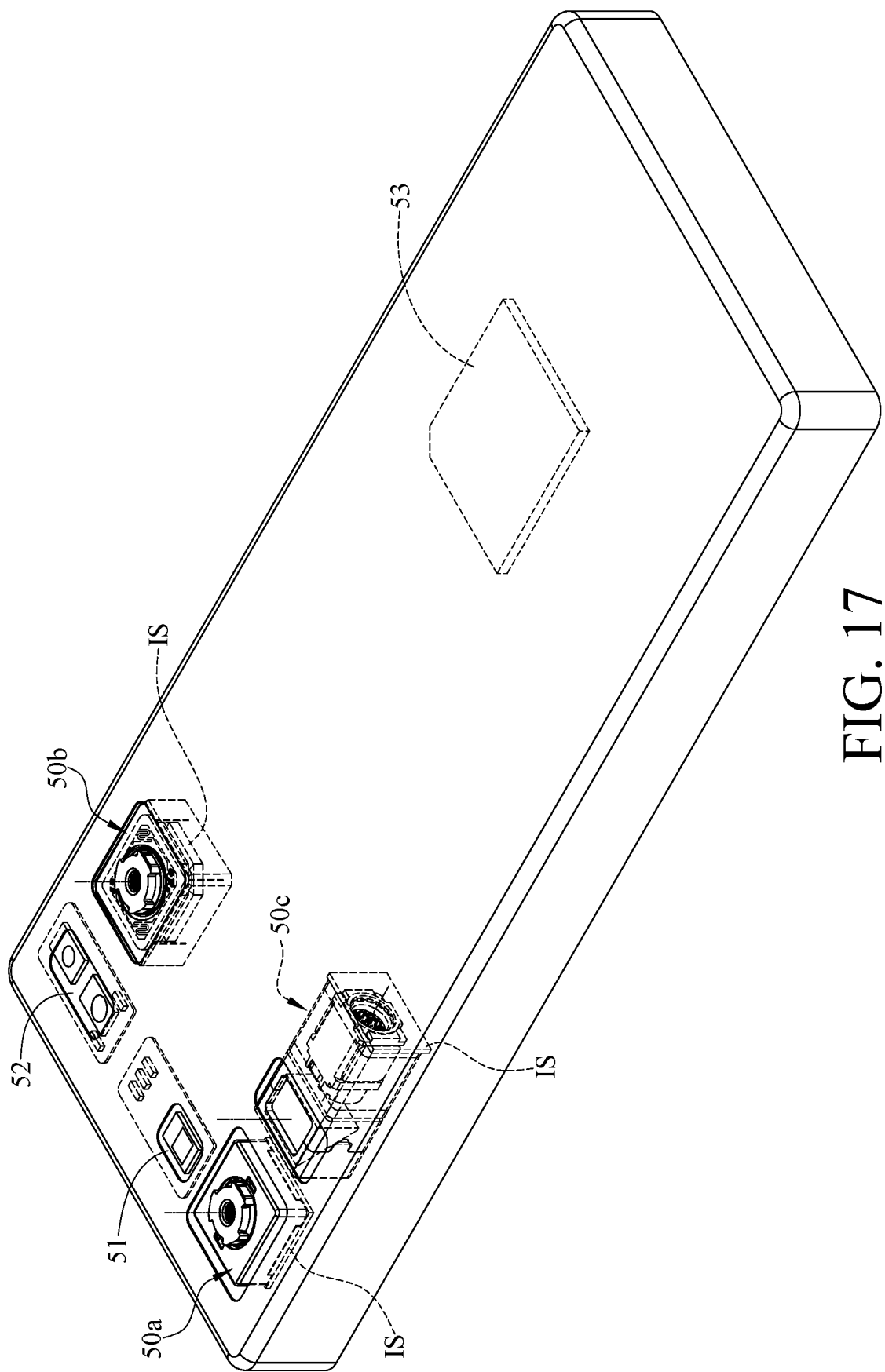
FIG. 17 is one perspective view of an electronic device according to the 5th embodiment of the present disclosure.
Figure 18:
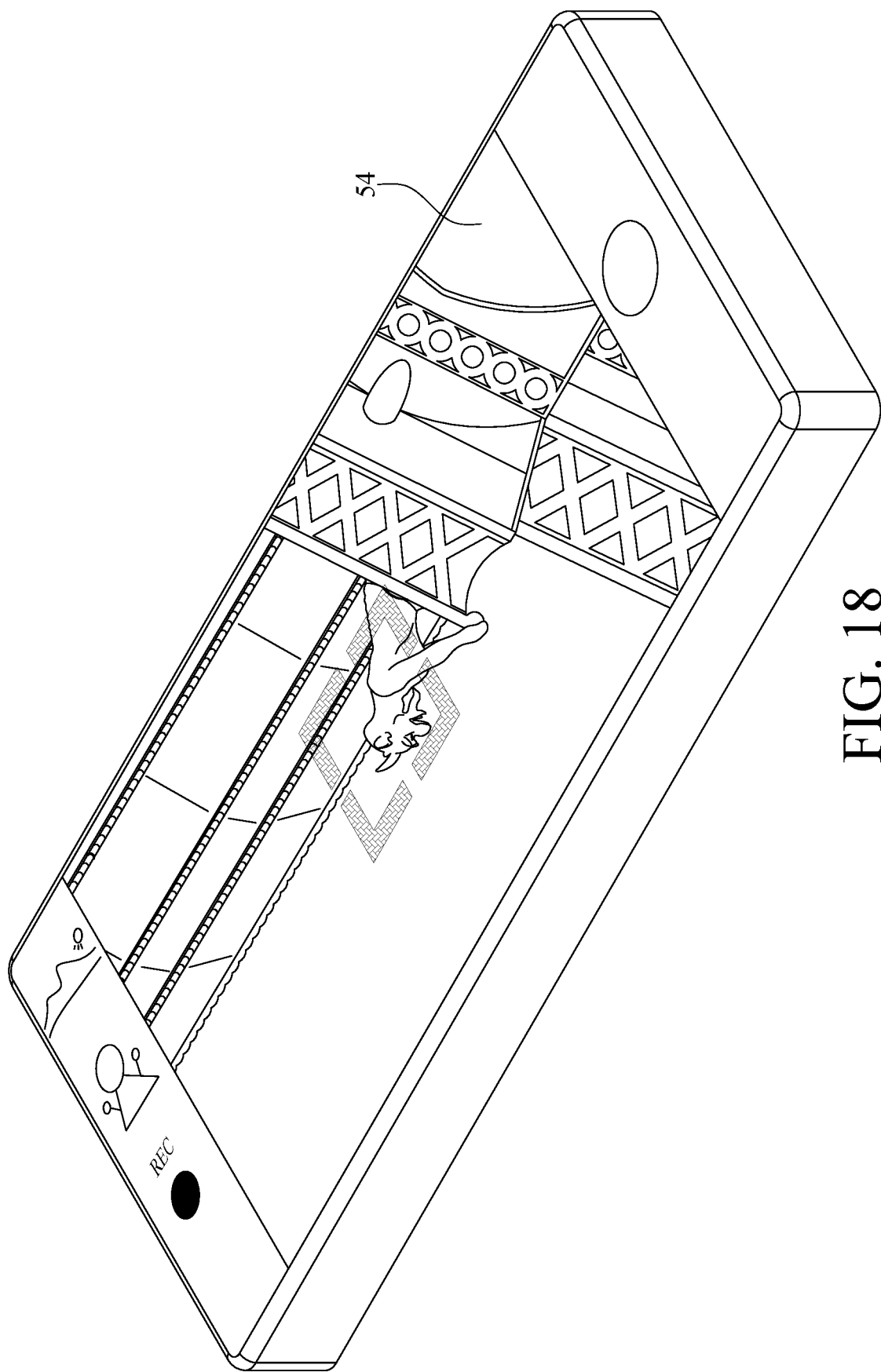
FIG. 18 is another perspective view of the electronic device in FIG. 17.

FIG. 17 is one perspective view of an electronic device according to the 5th embodiment of the present disclosure. FIG. 18 is another perspective view of the electronic device in FIG. 17.

In this embodiment, an electronic device 5 is a smartphone including a plurality of camera modules, a plurality of image sensors IS, a flash module 51, a focus assist module 52, an image signal processor 53, a user interface 54 and an image software processor.

The camera modules include an ultra wide angle camera module 50a, a high pixel camera module 50b and a telephoto camera module 50c. The camera module 1 disclosed in the 1st embodiment is taken as the telephoto camera module 50c. The image sensors IS are respectively disposed on the image surfaces of the ultra wide angle camera module 50a, the high pixel camera module 50b and the telephoto camera module 50c.

Figure 19:
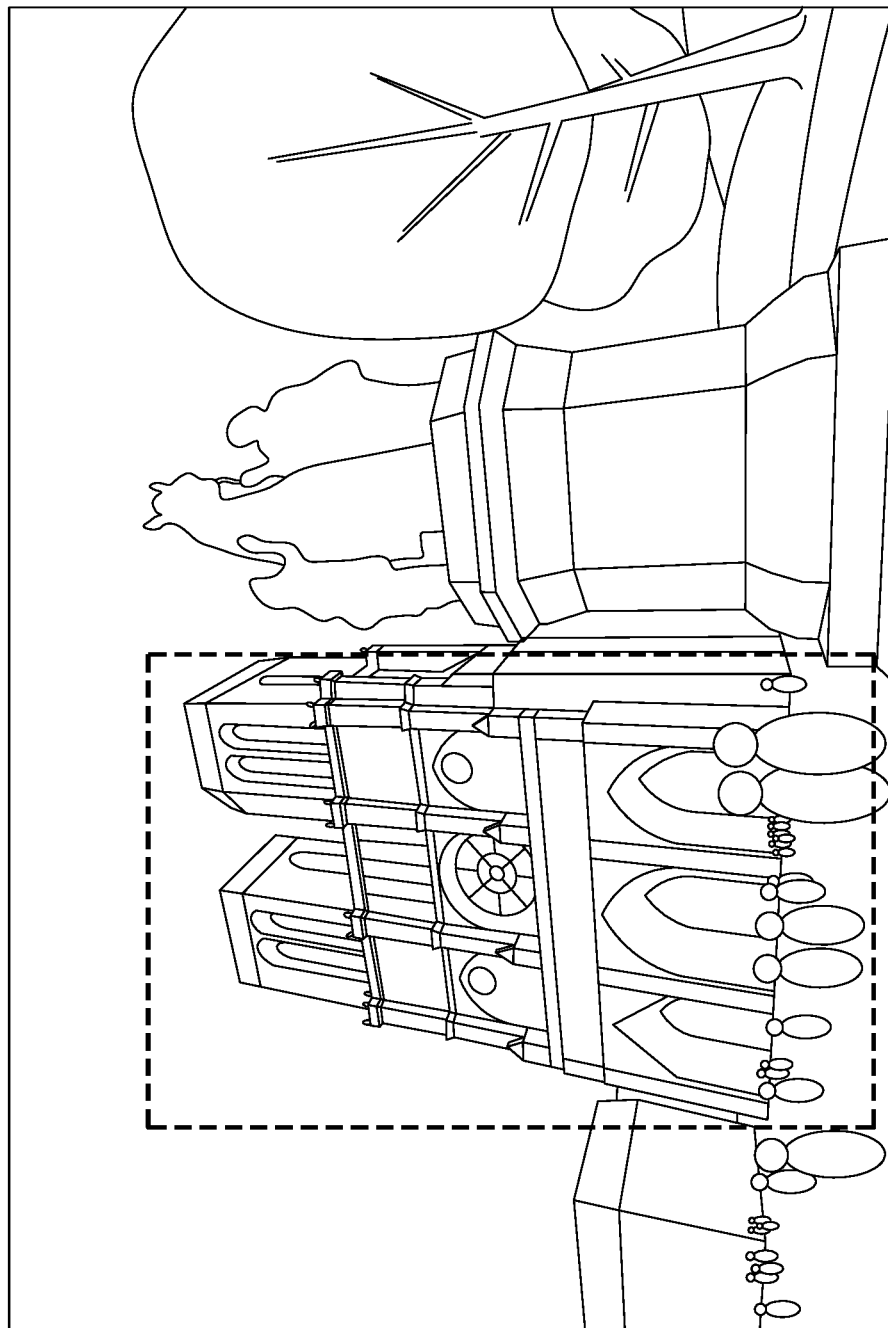
FIG. 19 is an image captured by an ultra wide angle camera module.

The image captured by the ultra wide angle camera module 50a enjoys a feature of multiple imaged objects. FIG. 19 is an image captured by an ultra wide angle camera module.

Figure 20:
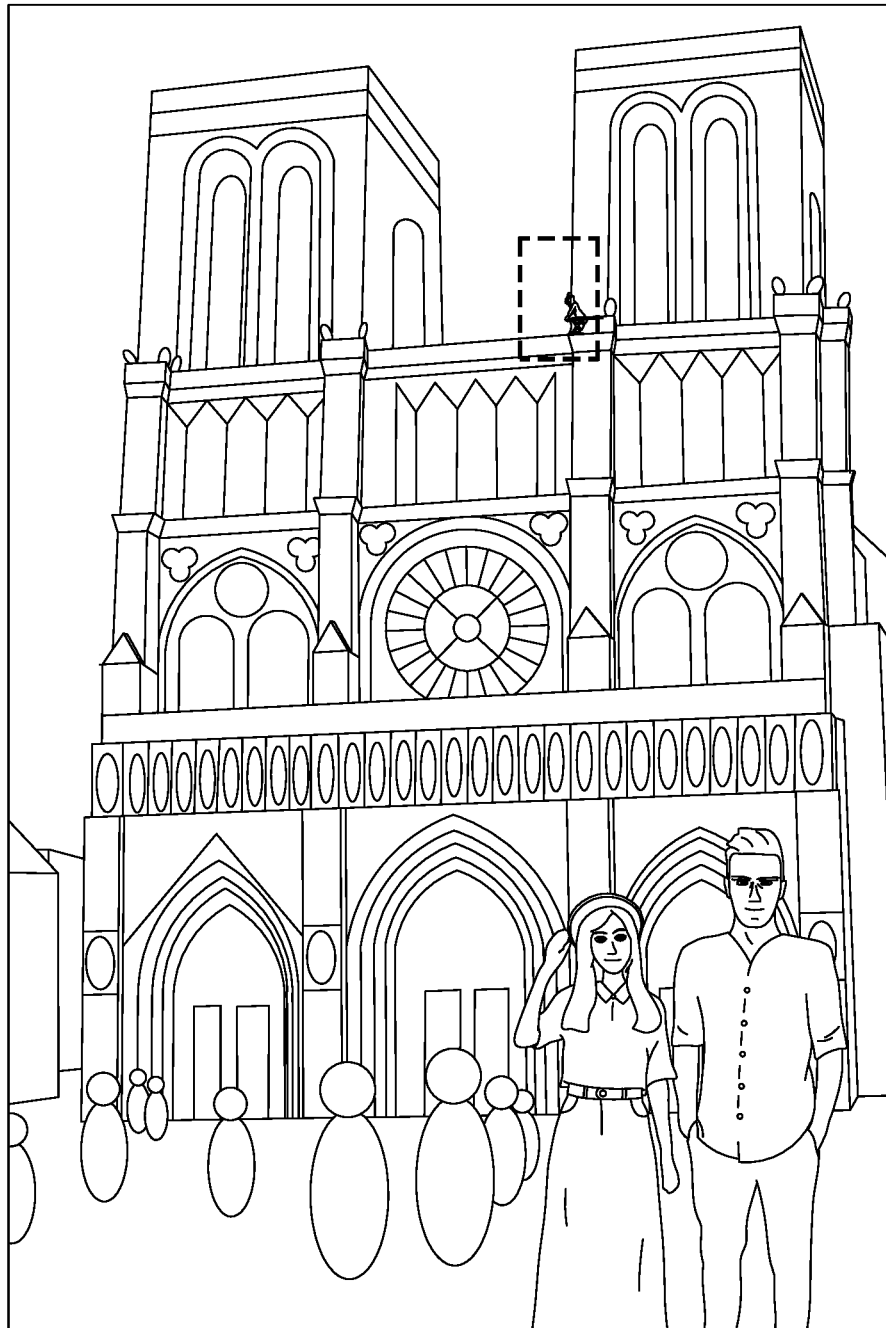
FIG. 20 is an image captured by a high pixel camera module.

The image captured by the high pixel camera module 50b enjoys a feature of high resolution and less distortion, and the high pixel camera module 50b can capture part of the image in FIG. 19. FIG. 20 is an image captured by a high pixel camera module.

Figure 21:
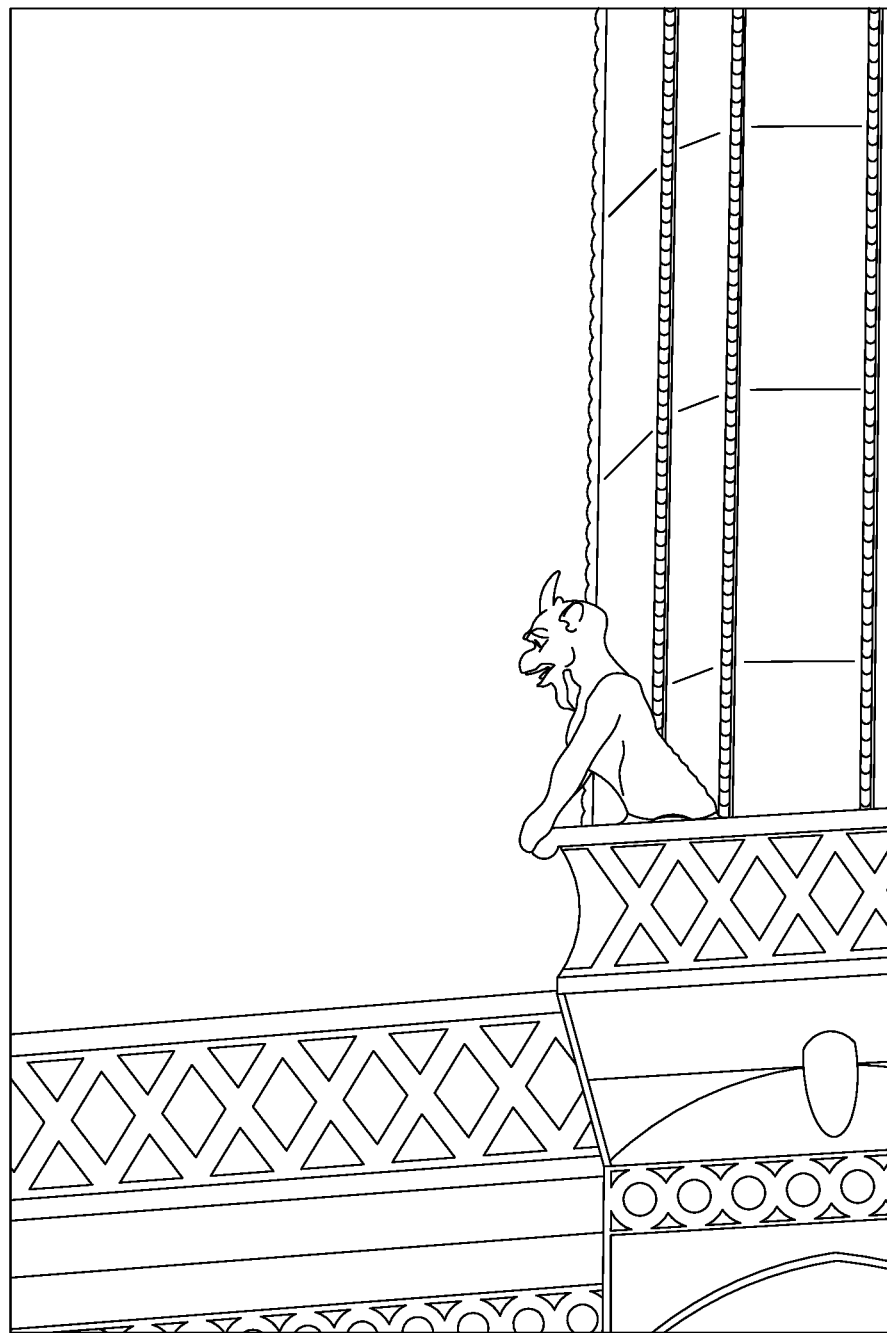
FIG. 21 is an image captured by a telephoto camera module.

The image captured by the telephoto camera module 50c enjoys a feature of high optical magnification, and the telephoto camera module 50c can capture part of the image in FIG. 20. FIG. 21 is an image captured by a telephoto camera module. The maximum field of view (FOV) of the camera module 1 corresponds to the field of view in FIG. 21.

When a user captures images of an object, the light rays converge in the camera module 1 to generate an image(s), and the flash module 51 is activated for light supplement. The focus assist module 52 detects the object distance of the imaged object to achieve fast auto focusing. The image signal processor 53 is configured to optimize the captured image to improve image quality. The light beam emitted from the focus assist module 52 can be either conventional infrared or laser. The user interface 54 can be a touch screen or a physical button. The user is able to interact with the user interface 54 and the image software processor having multiple functions to capture images and complete image processing. The image processed by the image software processor can be displayed on the user interface 54.

The smartphone in this embodiment is only exemplary for showing the camera module 1 of the present disclosure installed in an electronic device, and the present disclosure is not limited thereto. The camera module 1 can be optionally applied to optical systems with a movable focus. Furthermore, the camera module 1 features good capability in aberration corrections and high image quality, and can be applied to 3D (three-dimensional) image capturing applications, in products such as digital cameras, mobile devices, digital tablets, smart televisions, network surveillance devices, dashboard cameras, vehicle backup cameras, multi-camera devices, image recognition systems, motion sensing input devices, wearable devices and other electronic imaging devices.

The foregoing description, for the purpose of explanation, has been described with reference to specific embodiments. It is to be noted that the present disclosure shows different data of the different embodiments; however, the data of the different embodiments are obtained from experiments. The embodiments were chosen and described in order to best explain the principles of the disclosure and its practical applications, to thereby enable others skilled in the art to best utilize the disclosure and various embodiments with various modifications as are suited to the particular use contemplated. The embodiments depicted above and the appended drawings are exemplary and are not intended to be exhaustive or to limit the scope of the present disclosure to the precise forms disclosed. Many modifications and variations are possible in view of the above teachings.

What is claimed is:

1. A camera module, comprising:
   a housing configured to form a housing space;

a unitary element, which is one-piece formed from a lens carrier and a lens barrel, and the unitary element being movably disposed in the housing space;

an optical lens assembly disposed in the unitary element;

an image-side light blocking assembly located on an image side of the optical lens assembly, the image-side light blocking assembly comprising at least one light blocking sheet; and a driving device disposed between the housing and the unitary element, the driving device comprising a first driving member and a second driving member corresponding to each other, the first driving member being disposed on an element outer surface of the unitary element, and the second driving member being disposed in the housing space;

wherein there is no relative movement among the unitary element, the optical lens assembly and the image-side light blocking assembly, the driving device drives the unitary element, the optical lens assembly and the image-side light blocking assembly to move in an optical axis direction parallel to an optical axis of the optical lens assembly;

wherein a minimal inner opening of the unitary element is located between the optical lens assembly and the image-side light blocking assembly, a diameter of the minimal inner opening is smaller than an outer diameter of every lens element of the optical lens assembly and an outer diameter of every element of the image-side light blocking assembly;

wherein a maximum field of view of the camera module is FOV, and the following condition is satisfied:

10[deg.]<FOV<40[deg.].

2. The camera module of claim 1, further comprising an image-side assembling member disposed on one side of the unitary element closer to the image side, wherein a member inner surface of the image-side assembling member is opposite to a member outer surface of the image-side assembling member, the member inner surface surrounds the optical axis, and the member outer surface is farther away from the optical axis than the member inner surface;

wherein the unitary element comprises a first contact surface, either the member inner surface or the member outer surface comprises a second contact surface corresponding to the first contact surface, and the first contact surface contacts the second contact surface.

3. The camera module of claim 2, wherein a plurality of stripe-shaped structures are disposed on either the first contact surface of the unitary element or the second contact surface of the image-side assembling member, each of the stripe-shaped structures is in a shape of strip and extends along the optical axis direction.

4. The camera module of claim 2, wherein the image-side light blocking assembly is accommodated in the image-side assembling member.

5. The camera module of claim 2, wherein the image-side assembling member non-overlaps the first driving member in a direction orthogonal to the optical axis.

6. The camera module of claim 2, further comprising a light blocking unit disposed between the minimal inner opening of the unitary element and the image-side assembling member, wherein an object-side surface of the light blocking unit is abutted with the unitary element, and an image-side surface of the light blocking unit is abutted with the image-side assembling member.

7. The camera module of claim 1, wherein the image-side light blocking assembly is accommodated in the unitary element.

8. The camera module of claim 7, wherein the image-side light blocking assembly comprises a retaining element, and the image-side light blocking assembly is positioned in the unitary element by the retaining element.

9. The camera module of claim 8, wherein the unitary element further comprises a third contact surface, the retaining element comprises a fourth contact surface corresponding to the third contact surface, the third contact surface contacts the fourth contact surface, a plurality of stripe-shaped structures are disposed on either the third contact surface or the fourth contact surface, and each of the stripe-shaped structures is in a shape of strip and extends along the optical axis direction.

10. The camera module of claim 1, wherein the first driving member and the second driving member are a combination of at least one coil and at least one magnet.

11. The camera module of claim 10, wherein the number of the at least one magnet is two, the two magnets are respectively disposed on opposite sides of the optical axis, the number of the at least one coil is two, the two coils are respectively disposed on opposite sides of the optical axis, and the unitary element, the two coils and the two magnets are in a linear arrangement along a direction orthogonal to the optical axis.

12. The camera module of claim 11, wherein a first direction and a second direction are defined to be orthogonal to the optical axis direction, the first direction is orthogonal to the second direction, a length of the unitary element in the optical axis direction is A, a height of the unitary element in the first direction is B, a width of the unitary element in the second direction is C, and the following condition is satisfied:

0.03<(C−B)/A<0.3.

13. The camera module of claim 12, wherein at least a part of the optical lens assembly non-overlaps the unitary element in the first direction.

14. The camera module of claim 1, wherein the at least one light blocking sheet comprises a non-circular opening, the non-circular opening comprises a plurality of line section parts arranged along a circumferential direction of the optical axis, and the number of the line section parts is four or more.

15. The camera module of claim 14, wherein the image-side light blocking assembly comprises at least three light blocking sheets.

16. The camera module of claim 1, further comprising a first optical path folding element, wherein a first folding angle is formed between a first optical path and a second optical path, the second optical path is parallel to the optical axis, and the first optical path folding element is disposed between the first optical path and the second optical path.

17. The camera module of claim 16, further comprising a second optical path folding element, wherein a second folding angle is formed between the second optical path and a third optical path, and the second optical path folding element is disposed between the second optical path and the third optical path.

18. The camera module of claim 1, wherein the at least one light blocking sheet of the image-side light blocking assembly comprises an image-side light blocking sheet closest to the image side, an axial distance between the image-side light blocking sheet and the minimal inner opening of the unitary element is H1, the diameter of the minimal inner opening is H2, and the following condition is satisfied:

$0.05 < H1/H2 < 0.90$.

19. The camera module of claim 1, wherein the number of lens elements of the optical lens assembly is N, and the following condition is satisfied:

$4 \leq N \leq 10$.

20. The camera module of claim 19, wherein the optical lens assembly comprises a lens element and another lens element adjacent to each other, the another lens element is closer to the image side than the lens element, a maximum outer diameter of the lens element is larger than a maximum outer diameter of the another lens element.

21. An electronic device, comprising the camera module of claim 1 and an image sensor.

* * * * *